United States Patent
Matsumoto

(10) Patent No.: US 9,275,824 B2
(45) Date of Patent: Mar. 1, 2016

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/721,363

(22) Filed: May 26, 2015

(65) Prior Publication Data

US 2015/0348741 A1    Dec. 3, 2015

(30) Foreign Application Priority Data

Jun. 3, 2014 (JP) ................. 2014-114526

(51) Int. Cl.

| | | |
|---|---|---|
| G11B 9/10 | (2006.01) | |
| H01J 37/147 | (2006.01) | |
| H01J 37/20 | (2006.01) | |
| H01J 37/06 | (2006.01) | |
| H01J 37/317 | (2006.01) | |

(52) U.S. Cl.
CPC ............ *H01J 37/1472* (2013.01); *G11B 9/10* (2013.01); *H01J 37/06* (2013.01); *H01J 37/20* (2013.01); *H01J 37/3177* (2013.01); *H01J 2237/063* (2013.01); *H01J 2237/15* (2013.01); *H01J 2237/202* (2013.01); *H01J 2237/31715* (2013.01)

(58) Field of Classification Search
None
See application file for complete search history.

(56) References Cited

U.S. PATENT DOCUMENTS

| | | | |
|---|---|---|---|
| 5,260,579 A | 11/1993 | Yasuda et al. | |
| 5,546,319 A * | 8/1996 | Satoh .................... | B82Y 10/00 250/396 R |
| 5,747,814 A * | 5/1998 | Gordon ................. | B82Y 10/00 250/396 R |
| 7,777,201 B2 | 8/2010 | Fragner et al. | |
| 8,222,621 B2 | 7/2012 | Fragner et al. | |
| 2003/0025088 A1 | 2/2003 | Oae et al. | |

(Continued)

FOREIGN PATENT DOCUMENTS

| | | |
|---|---|---|
| JP | 5-166707 | 7/1993 |
| JP | 2014-112639 | 6/2014 |

OTHER PUBLICATIONS

U.S. Appl. No. 14/699,216, filed Apr. 29, 2015, Hiroshi Matsumoto et al.

*Primary Examiner* — Peter Vincent Agustin
(74) *Attorney, Agent, or Firm* — Oblon, McClelland, Maier & Neustadt, L.L.P.

(57) ABSTRACT

A multi charged particle beam writing method includes emitting each corresponding beam in an "on" state while starting and continuing tracking control, shifting a writing position by beam deflection of the multi beams, in addition to tracking control, while continuing tracking control, emitting each corresponding beam in the next "on" state to the next writing position having been shifted while continuing tracking control, and returning the tracking position by resetting tracking control, after emitting each next corresponding beam to the next writing position having been shifted at least once, wherein writing of a predetermined region is completed by repeating the number of preset times a group of performing emitting, shifting, emitting, and returning, wherein the tracking time from start to reset of tracking control in at least one of the repeated groups is longer than the others.

10 Claims, 15 Drawing Sheets

(56) References Cited

U.S. PATENT DOCUMENTS

| | | | | |
|---|---|---|---|---|
| 2005/0116180 A1* | 6/2005 | Komagata | | B82Y 10/00 250/492.1 |
| 2007/0152169 A1* | 7/2007 | Tamamushi | | B82Y 10/00 250/492.1 |
| 2008/0073588 A1* | 3/2008 | Kruit | | B82Y 10/00 250/492.21 |
| 2008/0093562 A1* | 4/2008 | Kasono | | B82Y 10/00 250/396 R |
| 2008/0296515 A1* | 12/2008 | Abe | | B82Y 10/00 250/492.3 |
| 2008/0315112 A1* | 12/2008 | Wiesner | | B82Y 10/00 250/396 R |
| 2010/0072390 A1* | 3/2010 | Yashima | | B82Y 10/00 250/396 R |
| 2011/0066272 A1* | 3/2011 | Anpo | | B82Y 10/00 700/103 |
| 2011/0089346 A1* | 4/2011 | Tsuruta | | B82Y 10/00 250/492.22 |
| 2012/0187307 A1* | 7/2012 | Inoue | | H01J 37/3023 250/397 |
| 2012/0211676 A1* | 8/2012 | Kamikubo | | H01J 37/3174 250/492.22 |
| 2013/0157198 A1* | 6/2013 | Yoshikawa | | G03F 7/2059 430/296 |
| 2014/0124684 A1 | 5/2014 | Matsumoto et al. | | |

* cited by examiner

| Checksum | t1 | t2 | · · · | t512 |

FIG. 8

| 25 | 17 | 9 | 1 |
|----|----|---|---|
| 25 | 17 | 9 | 1 |
| 25 | 17 | 9 | 1 |
| 25 | 17 | 9 | 1 |

| 25 | 25 | 25 | 25 |
|----|----|----|----|
| 17 | 17 | 17 | 17 |
| 9  | 9  | 9  | 9  |
| 1  | 1  | 1  | 1  |

FIG. 15

| 29 | 21 | 13 | 5 |
|----|----|----|---|
| 29 | 21 | 13 | 5 |
| 29 | 17 | 9  | 1 |
| 29 | 17 | 9  | 1 |

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2014-114526 filed on Jun. 3, 2014 in Japan, the entire contents of which are incorporated herein by reference.

BACKGROUND OF THE INVENTION

1. Field of the Invention

Embodiments of the present invention relate generally to a multi charged particle beam writing method and a multi charged particle beam writing apparatus, and more specifically, for example, relate to a method for reducing the writing time of multi-beam writing by tracking deflection.

2. Description of Related Art

In recent years, with high integration of LSI, the line width (critical dimension) required for circuits of semiconductor devices is becoming progressively narrower. As a method for forming an exposure mask (also called a reticle) used to form circuit patterns on these semiconductor devices, the electron beam (EB) writing technique having excellent resolution is employed.

As an example employing the electron beam writing technique, a writing apparatus using multiple beams (multi-beams) can be cited. Compared with the case of writing a pattern by using a single electron beam, since it is possible to emit multiple beams at a time (one shot) in multi-beam writing, the throughput can be greatly increased. For example, in a writing apparatus employing a multi-beam system, multiple beams are formed by letting portions of an electron beam emitted from an electron gun assembly pass through a corresponding hole of a plurality of holes formed in the mask, blanking control is performed for each beam, and each unblocked beam is reduced by an optical system and deflected by a deflector so as to irradiate a desired position on a target object or "sample".

Conventionally, pixels are defined by dividing a writing region in the surface of a target object into a plurality of mesh regions by the beam size. Then, during irradiation of multiple beams of each shot to the target object placed on the stage moving at a fixed speed, irradiation of each beam is executed while each beam performs a tracking operation following the stage movement so that a pixel to be irradiated by each beam may not be deviated by the stage movement. After one shot is completed, the tracking operation is reset to swing back each beam, and the deflection position is shifted to a next pixel to be irradiated. Then, in the same way, each beam irradiation is performed while executing the tracking operation. Thus, a pattern is written by performing necessary beam irradiation for each of the entire pixels.

As described above, multiple beams are used in multi-beam writing. For example, irradiation time data for n×m beams is transmitted to an irradiation unit from a control unit within an irradiation time. Therefore, it is necessary to cope with errors of data transmission to the irradiation unit from the control unit.

In connection with the multi-beam technique, there is disclosed, a technique where a tracking operation in response to a stage movement is performed while multi beams are continuously scanned in one direction by the raster scan method (refer to, e.g., Japanese Published Unexamined Patent Application (JP-A) No. 05-166707).

BRIEF SUMMARY OF THE INVENTION

According to one aspect of the present invention, a multi charged particle beam writing method includes: emitting each corresponding beam in an "on" state in multi charged particle beams to a writing position of the each corresponding beam while starting and continuing tracking control by performing beam deflection such that the writing position of the each corresponding beam of the multi charged particle beams collectively follow a movement of a stage; shifting a writing position of each corresponding beam in a next "on" state in the multi charged particle beams to a next writing position of the each corresponding beam in the next "on" state by performing beam deflection of the multi charged particle beams, in addition to the beam deflection for the tracking control, while continuing the tracking control; emitting the each corresponding beam in the next "on" state in the multi charged particle beams to the next writing position having been shifted of the each corresponding beam in the next "on" state while continuing the tracking control; and returning a tracking position in an opposite direction from the movement of the stage by resetting the tracking control by performing the beam deflection, after emitting each next corresponding beam to the next writing position having been shifted at least once of the each corresponding beam in the next "on" state while continuing the tracking control, wherein writing of a predetermined region is completed by repeating, a number of times having been set in advance, a group of performing the emitting the each corresponding beam during from the starting the tracking control to the resetting the tracking control, performing the shifting, performing the emitting after the shifting, and performing the returning the tracking position in the opposite direction, and with respect to the group repeated the number of times having been set in advance, a tracking time, from the starting the tracking control to the resetting the tracking control, in at least one the group is longer than the tracking time of other group.

According to another aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam of the multiple beams having passed through the plurality of openings of the aperture member, a blanking aperture member configured to block each beam having been deflected to be in an "off" state by at least one of the plurality of blankers, a first deflector configured to collectively deflect each beam in an "on" state having passed through the blanking aperture member to a writing position of the each beam, a second deflector configured to collectively deflect the each beam in the "on" state having passed through the blanking aperture member in such a way as to follow a movement of the stage, and a deflection control unit configured to control the first deflector to deflect the each beam in the "on" state to a corresponding writing position, and after a writing time has passed, to deflect the each beam in the "on" state to be shifted to a next corresponding writing position, and to control the second deflector to continue tracking to follow the movement of the stage with respect to the each beam in the "on" state while the each beam irradiates the writing position and while the each beam irradiates the writing position which has been shifted at least once, and after the each beam irradiates the writing position which has been shifted at least once, to return a tracking position in an opposite direction from the movement of the stage by resetting the beam deflection for the tracking control, wherein writing of a predetermined region is completed by repeating, a number of times having been set, a group of performing the emitting the each corresponding beam to the writing position of the each beam during from the starting the tracking control to the resetting the tracking control, and performing the emitting the each corresponding beam to the next writing position having been shifted at least once, and with respect to the group repeated the number of times having been set, a tracking time, from the starting the tracking control to the resetting the tracking control, in at least one the group is longer than the tracking time of other group.

Moreover, according to another aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam of the multiple beams having passed through the plurality of openings of the aperture member, a blanking aperture member configured to block each beam having been deflected to be in an "off" state by at least one of the plurality of blankers, a deflector configured to collectively deflect the each beam in an "on" state having passed through the blanking aperture member to a writing position of the each beam, and collectively deflect the each beam in the "on" state in such a way as to follow a movement of the stage, and a deflection control unit configured to control the deflector to deflect the each beam in the "on" state to a corresponding writing position, and after a writing time has passed, to deflect the each beam in the "on" state to be shifted to a next corresponding writing position, and to control the deflector to continue tracking of the each beam in the "on" state while the each beam irradiates the writing position and while the each beam irradiates the writing position which has been shifted at least once, and after the each beam irradiates the writing position which has been shifted at least once, to return a tracking position in an opposite direction of the movement of the stage, by resetting the beam deflection for the tracking control, wherein writing of a predetermined region is completed by repeating, a number of times having been set, a group of performing the emitting the each corresponding beam in the "on" state to the writing position of the each beam in the "on" state during from the starting the tracking control to the resetting the tracking control, and performing the emitting the each corresponding beam in the "on" state to the next writing position having been shifted at least once, and with respect to the group repeated the number of times having been set, a tracking time, from the starting the tracking control to the resetting the tracking control, in at least one the group is longer than the tracking time of other group.

BRIEF DESCRIPTION OF THE DRAWINGS

FIG. 8 shows an example of irradiation time arrangement data according to the first embodiment;

FIG. 9 shows an example of numbers of beams to write respective pixels in a grid concerned according to the first embodiment;

FIG. 14 shows another example of numbers of beams to write respective pixels in a grid concerned according to the first embodiment;

FIG. 15 shows another example of numbers of beams to write respective pixels in a grid concerned according to the first embodiment.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used.

In the following embodiments, there will be described a multi charged particle beam writing method and apparatus that can perform complement even when a data transmission error occurs.

First Embodiment

Figure 1:
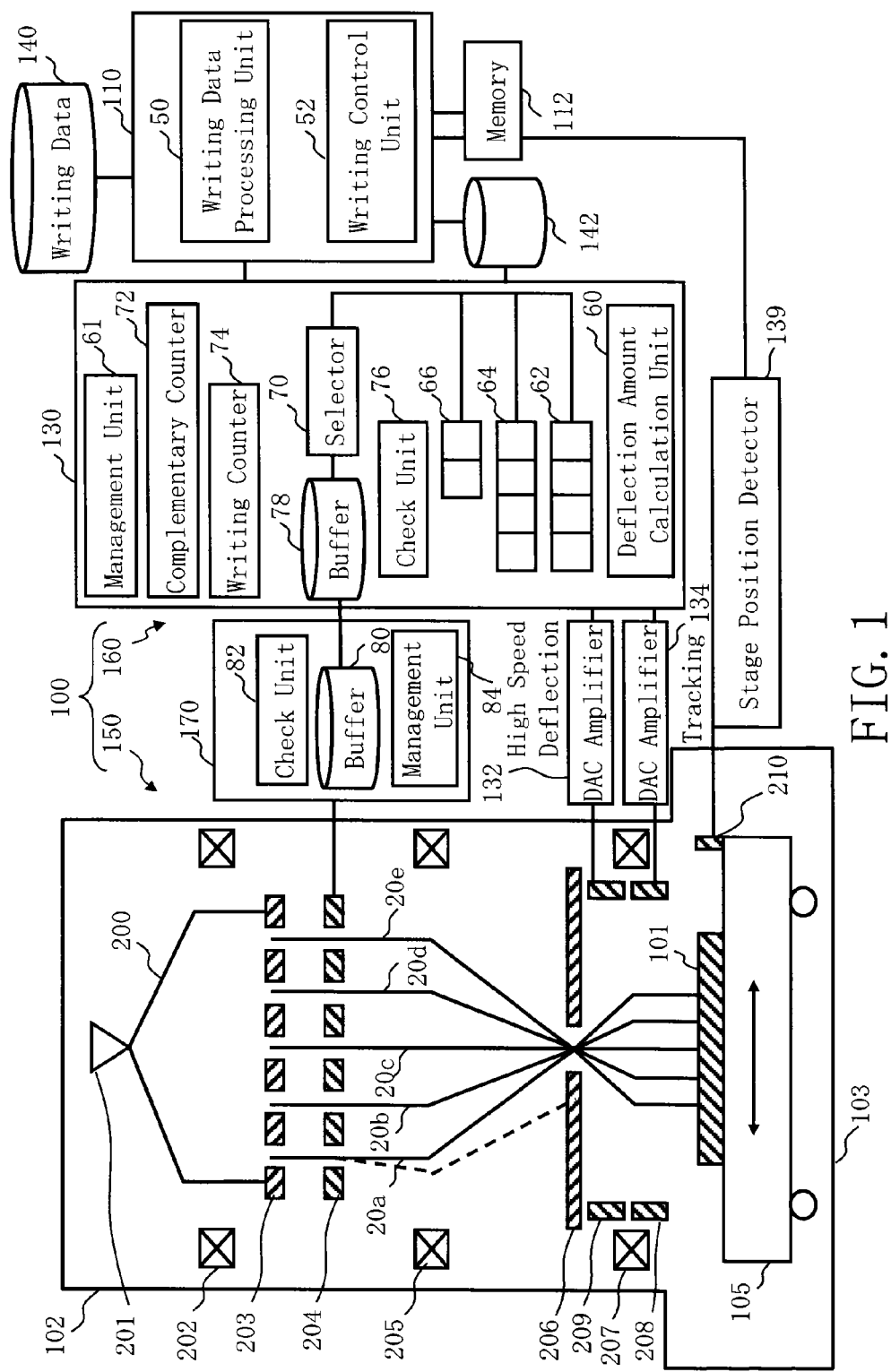
FIG. 1 is a schematic diagram showing a configuration of a writing apparatus according to the first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and deflectors 208 and 209. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. Moreover, a mirror 210 for measuring the position of the XY stage 105 is arranged on the XY stage 105.

The control unit 160 includes a control computer 110, a memory 112, a deflection control circuit 130 (deflection control unit), a DAC (digital-analog converter) amplifier units 132 and 134, a stage position detector 139, an interface circuit 170, and storage devices 140 and 142 such as magnetic disk drives. The control computer 110, the memory 112, the deflection control circuit 130, the stage position detector 139 and the storage devices 140 and 142 are connected with each other through a bus (not shown). Writing data is input into the storage device 140 (storage unit) from the outside, and stored therein. The interface circuit 170 and the DAC amplifier units 132 and 134 are connected to the deflection control circuit 130. The DAC amplifier unit 132 is connected to the deflector 209, and the DAC amplifier unit 134 is connected to the deflector 208. The interface circuit 170 is connected to the blanking plate 204. The interface circuit 170 is arranged in the vicinity of the electron optical column 102. The deflection control circuit 130 is arranged outside the chamber where the electron optical column 102 is provided, through a cable of about 10 m long, in order not to affect writing. Therefore, the interface circuit includes a check unit 82 for checking whether there is an error in data received from the deflection control circuit.

In the control computer 110, there are arranged a writing data processing unit 50 and a writing control unit 52. Each function, such as the writing data processing unit 50 and the writing control unit 52 may be configured by hardware such as an electric circuit, or by software such as a program that causes a computer to implement these functions. Alternatively, it may be configured by a combination of hardware and software. Data which is input and output to/from the writing data processing unit 50 and the writing control unit 52, and data being operated are stored in the memory 112 each time. When at least one of the writing data processing unit 50 and the writing control unit 52 is configured by software, a computer, such as a CPU or a GPU, is arranged in the control computer 110.

In the deflection control circuit 130, there are arranged a deflection amount calculation unit 60, a management unit 61, buffers 62, 64, and 66, a selector 70, a complementary counter 72, a writing counter 74, a check unit 76, and a buffer 78. Each function, such as the deflection amount calculation unit 60, the management unit 61, the selector 70, the complementary counter 72, the writing counter 74, and the check unit 76 may be configured by hardware such as an electric circuit, or by software such as a program that causes a computer to implement these functions. Alternatively, it may be configured by a combination of hardware and software. Data which is input and output to/from the deflection amount calculation unit 60, the management unit 61, the selector 70, the complementary counter 72, the writing counter 74, and the check unit 76, and data being operated are stored in a memory (not shown) each time. When at least one of the deflection amount calculation unit 60, the selector 70, the complementary counter 72, the writing counter 74, and the check unit 76 is configured by software, a computer, such as a CPU or a GPU, is arranged in the deflection control circuit 130.

In the interface circuit 170, there are arranged a buffer 80, the check unit 82, and a management unit 84. Each function, such as the check unit 82 and the management unit 84, may be configured by hardware such as an electric circuit, or by software such as a program that causes a computer to implement these functions. Alternatively, it may be configured by a combination of hardware and software. Data which is input and output to/from the check unit 82 and the management unit 84, and data being operated are stored in a memory (not shown) each time. When at least one of the check unit 82 and the management unit 84 is configured by software, a computer, such as a CPU or a GPU, is arranged in the interface circuit 170.

The interface circuit 170 is arranged in the periphery of the writing unit 150, in other words, in the vicinity of the writing unit 150. The interface circuit 170 receives a blanking control signal from the deflection control circuit 130 arranged away from the writing unit 150, and outputs it to the control circuit for each blanker (to be described later) arranged on the blanking plate 204.

FIG. 1 shows a configuration necessary for explaining the first embodiment. Other configuration elements generally necessary for the writing apparatus 100 may also be included.

Figure 2:
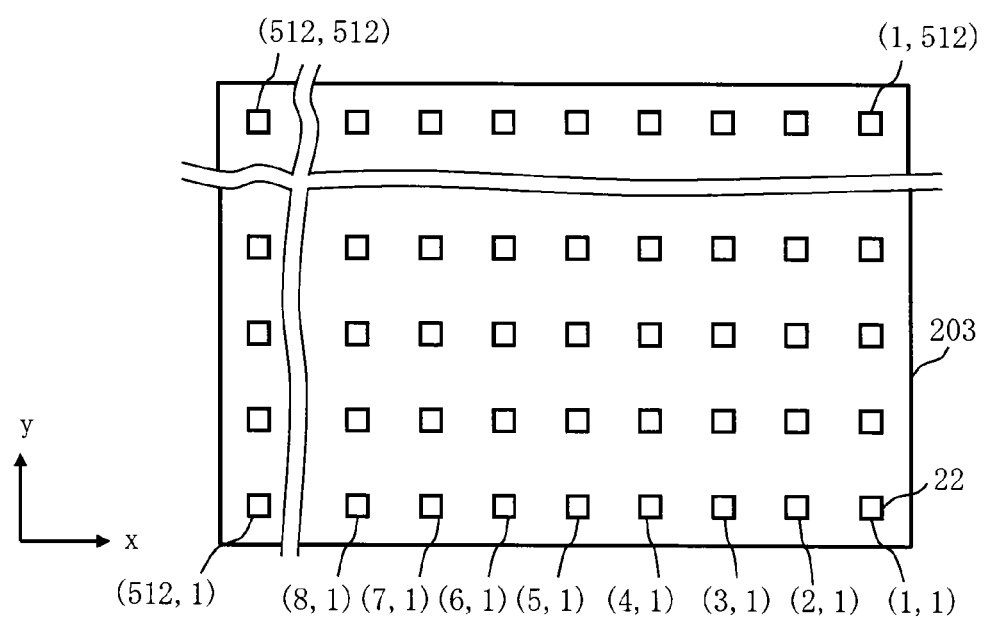
FIG. 2 is a conceptual diagram showing a structure of an aperture member according to the first embodiment.

FIG. 2 is a conceptual diagram showing an example of the structure of an aperture member according to the first embodiment. In FIG. 2, holes (openings) 22 of m rows long (y direction) and n columns wide (x direction) (m≥2, n≥2) are formed, like a matrix, at a predetermined arrangement pitch in the aperture member 203. In FIG. 2, for example, holes 22 of 512 (rows)×512 (columns) are formed in the length and width (x and y) directions. Each of the holes 22 is a quadrangle of the same dimensional shape. Alternatively, each of the holes 22 can be a circle of the same circumference. Multi-beams 20 are formed by letting portions of an electron beam 200 respectively pass through a corresponding hole of a plurality of holes 22. The case in which the holes 22 of two or more rows and columns are arranged in the length and width (x and y) directions is shown here, but the arrangement is not limited thereto. For example, it is also acceptable that a plurality of holes 22 are arranged in only one row (x direction) or in only one column (y direction). That is, in the case of only one row, there are arranged a plurality of holes 22 as a plurality of columns, and in the case of only one column, there are arranged a plurality of holes 22 as a plurality of rows. Moreover, the method of arranging the holes 22 is not limited to the case of FIG. 2 where holes are arranged like a grid in the length and width directions. For example, with respect to the kth row and the (k+1)th row, which are arrayed in the length direction (y direction), each hole in the kth row and each hole in the (k+1)th row may be mutually displaced in the width direction (x direction) by a dimension "a". Similarly, each hole in the (k+1)th row and each hole in the (k+2)th row may be mutually displaced in the width direction (x direction) by a dimension "b", for example.

Figure 3:
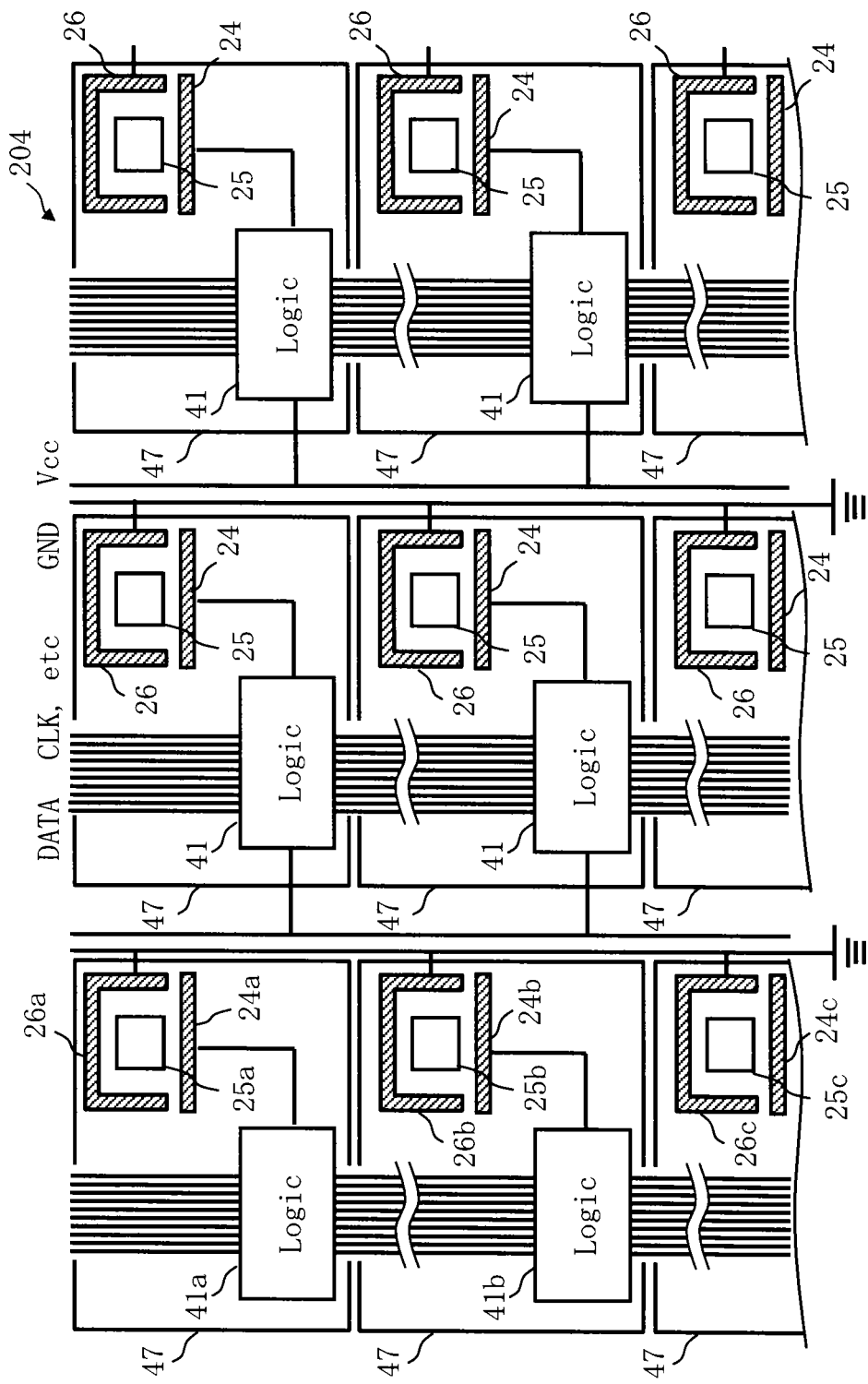
FIG. 3 is a top view conceptual diagram showing a part of a blanking plate according to the first embodiment.

FIG. 3 is a top view conceptual diagram showing a part of a blanking plate according to the first embodiment. In FIG. 3, the positions of electrodes 24 and 26 and the position of a control circuit 41 are not in accordance with each other. In the blanking plate 204, as shown in FIG. 3, there are formed passage holes 25 (openings), through which multiple beams respectively pass, at the positions each corresponding to each hole 22 of the aperture member 203 of FIG. 2. Then, a pair of electrodes 24 and 26 (blanker: blanking deflector) for blanking deflection is arranged at the opposite sides of and close to each passage hole 25. Moreover, close to each passage hole 25, there is arranged a control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, 10-bit parallel lines for control signals are connected to each control circuit 41. In addition to the 10-bit parallel lines, for example, a clock signal line and a power source line are connected to each control circuit 41. A part of the parallel lines may be used as the clock signal line and the power source line. A separate blanking system 47 composed of the electrodes 24 and 26 and the control circuit 41 is configured for each beam of multiple beams. A control signal for each control circuit 41 is output from the interface circuit 170. Moreover, a shift register (not shown) is arranged in each control circuit 41, and for example, shift registers for beams in one row of n×m multi beams in the control circuit are connected in series. For example, control signals for beams in one row of the n×m multi beams are transmitted in series. For example, a control signal of each beam is stored in a corresponding control circuit 41 by clock signals of n times.

The electron beam 20 passing through a corresponding passage hole is deflected by the voltage independently applied to the two electrodes 24 and 26 being a pair. Blanking control is performed by this deflection. Blanking deflection is performed for each corresponding beam of the multi-beams. Thus, a plurality of blankers respectively perform blanking deflection of a corresponding beam of the multi-beams having passed through a plurality of holes 22 (openings) of the aperture member 203.

Figure 4:
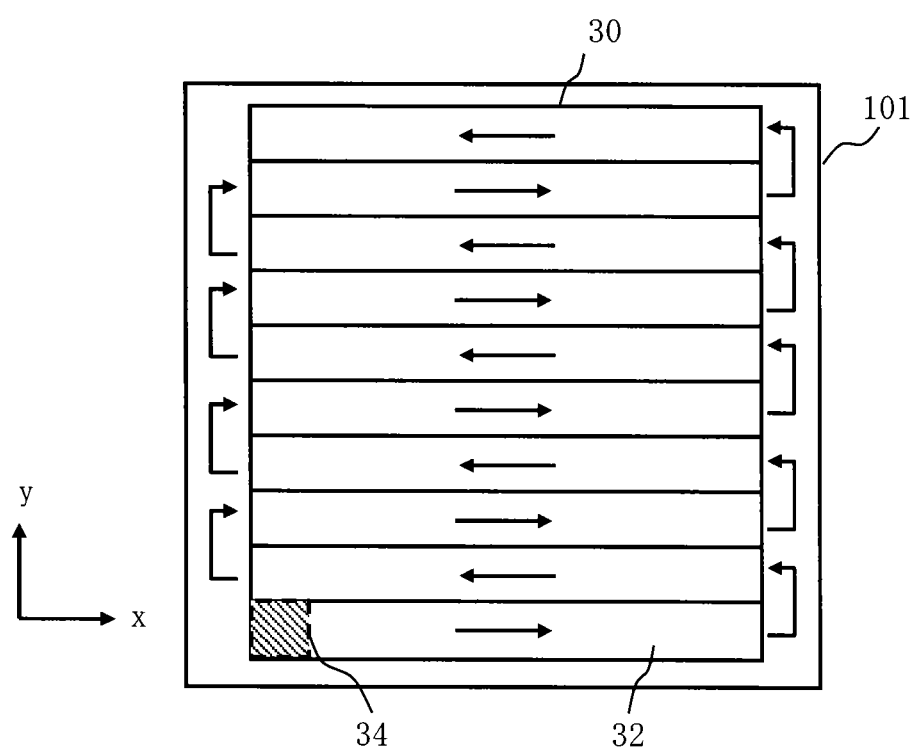
FIG. 4 is a conceptual diagram explaining an example of a writing operation according to the first embodiment.

FIG. 4 is a conceptual diagram explaining an example of a writing operation according to the first embodiment. As shown in FIG. 3, a writing region 30 of the target object 101 is virtually divided into a plurality of stripe regions 32 each in a strip shape and each having a predetermined width in the y direction, for example. Each of the stripe regions 32 serves as a unit region for writing. First, the XY stage 105 is moved to make an adjustment such that an irradiation region 34 which can be irradiated by one irradiation of the multi-beams 20 is located at the left end of the first stripe region 32 or at a position more left than the left end, and then writing is started. When writing the first stripe region 32, by moving the XY stage 105 in the −x direction, for example, the writing advances relatively in the x direction. The XY stage 105 is, for example, continuously moved at a predetermined speed. After writing the first stripe region 32, the stage position is moved in the −y direction to make an adjustment such that the irradiation region 34 is located at the right end of the second stripe region 32 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, a plurality of shot patterns whose number is equal, at the maximum, to the number of the holes 22 are formed at a time by multi-beams which have been formed by passing through respective corresponding holes 22 of the aperture member 203.

Figure 5:
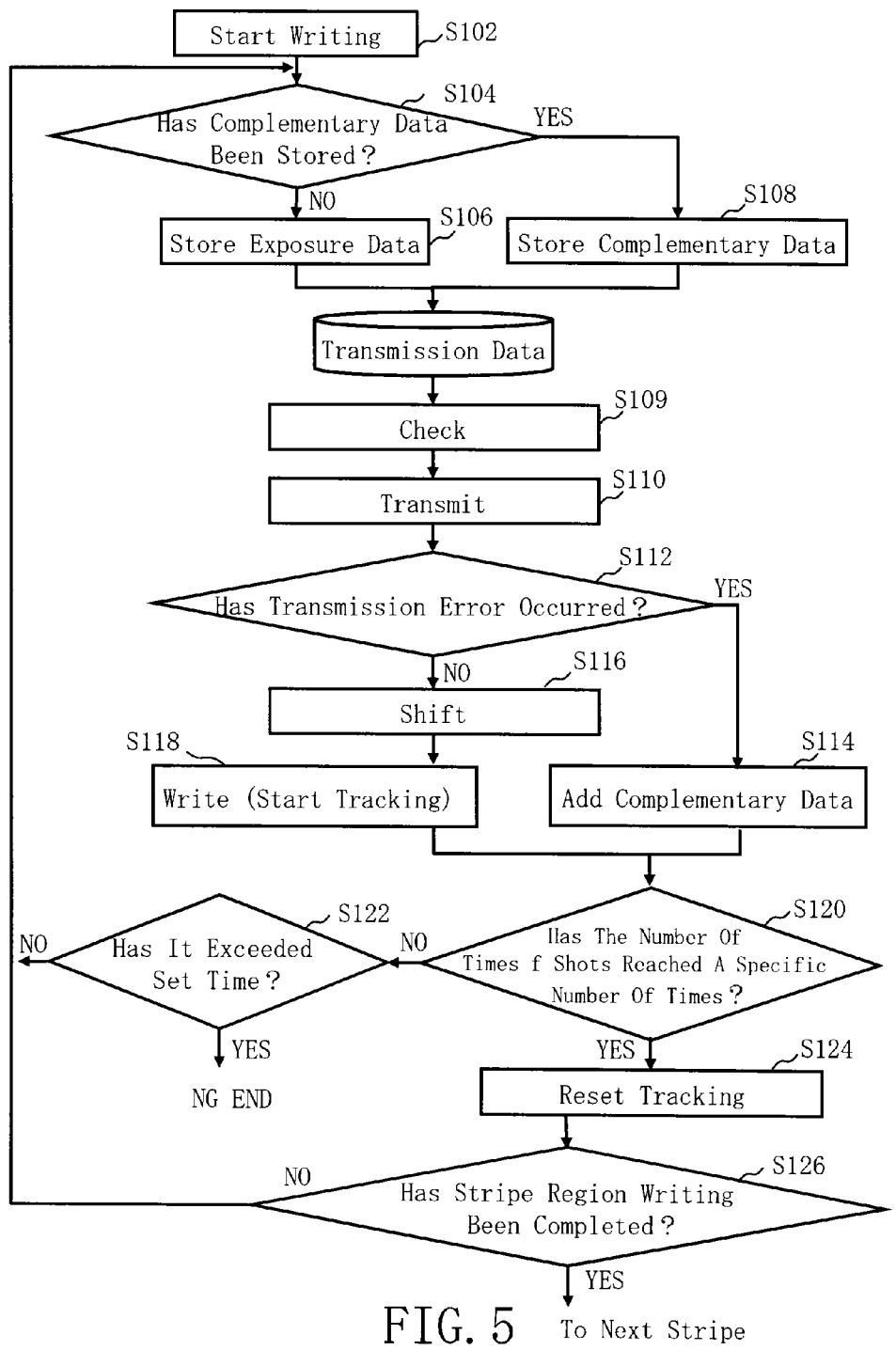
FIG. 5 is a flowchart showing main steps of a writing method according to the first embodiment.

FIG. 5 is a flowchart showing main steps of a writing method according to the first embodiment. In FIG. 5, the writing method of the first embodiment executes a series of steps: a writing start step (S102), a determination step (S104), an exposure data storing step (S106), a complementary data storing step (S108), a check step (S109), a transmission step (S110), a determination step (S112), a complementary data addition step (S114), a shift step (S116), a writing and track-ing start step (S118), a determination step (S120), a determination step (S122), a tracking reset step (S124), and a determination step (S126).

Figure 6:
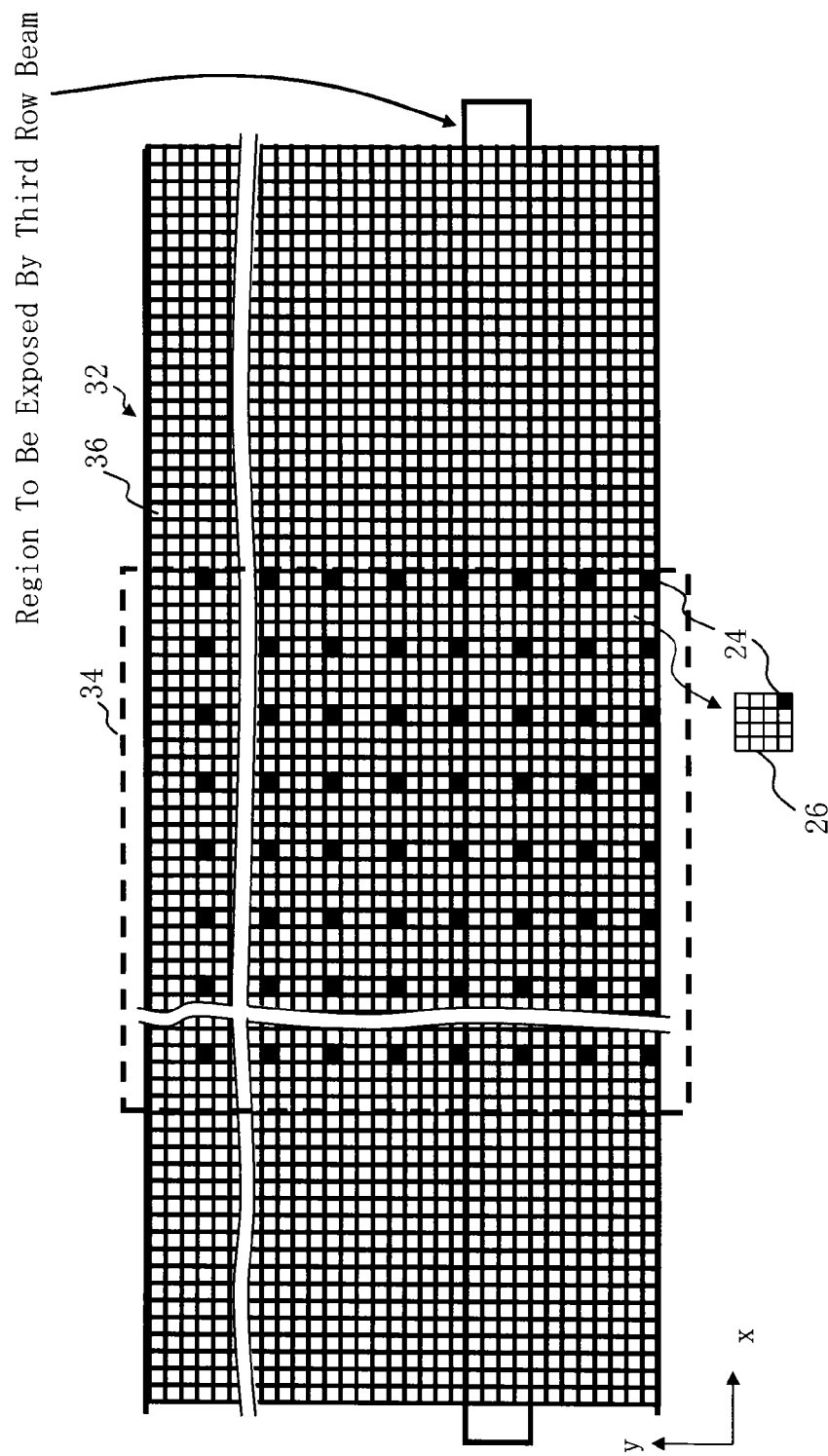
FIG. 6 shows an example of an irradiation region of multi-beams and a pixel to be written according to the first embodiment.

FIG. 6 shows an example of an irradiation region of multi-beams and a pixel to be written according to the first embodiment. In FIG. 6, the stripe region 32 is divided into a plurality of mesh regions by the beam size of multi-beams, for example. Each mesh region serves as a pixel 36 to be written (writing position). The size of the pixel 36 to be written is not limited to the beam size. For example, it may be 1/n (n being an integer of 1 or more) of the beam size. FIG. 6 shows the case where the writing region of the target object 101 is divided into a plurality of stripe regions 32 by the width (of short side) (size in the y direction) being substantially the same as the length size of the irradiation region 34, which can be irradiated by one irradiation of the multi-beam 20, for example. The width of the stripe region 32 is not limited to this. It is also preferable for the width of the stripe region 32 to be n times (n being an integer of 1 or more) the size of the irradiation region 34. FIG. 6 shows the case of multi-beams of 512×512 (rows by columns). In the irradiation region 34, there are shown a plurality of pixels 24 (writing positions of beams) which can be irradiated by one irradiation of the multi-beams 20. In other words, the pitch between the adjacent pixels 24 is the pitch between beams of the multi-beams. In the example of FIG. 6, one grid 26 being a square region is surrounded at four corners by four pixels 24, and one of the four pixels 24 is included in the grid 26 concerned. In the case of FIG. 6, each grid 26 is configured by 4×4 pixels.

Figure 7:
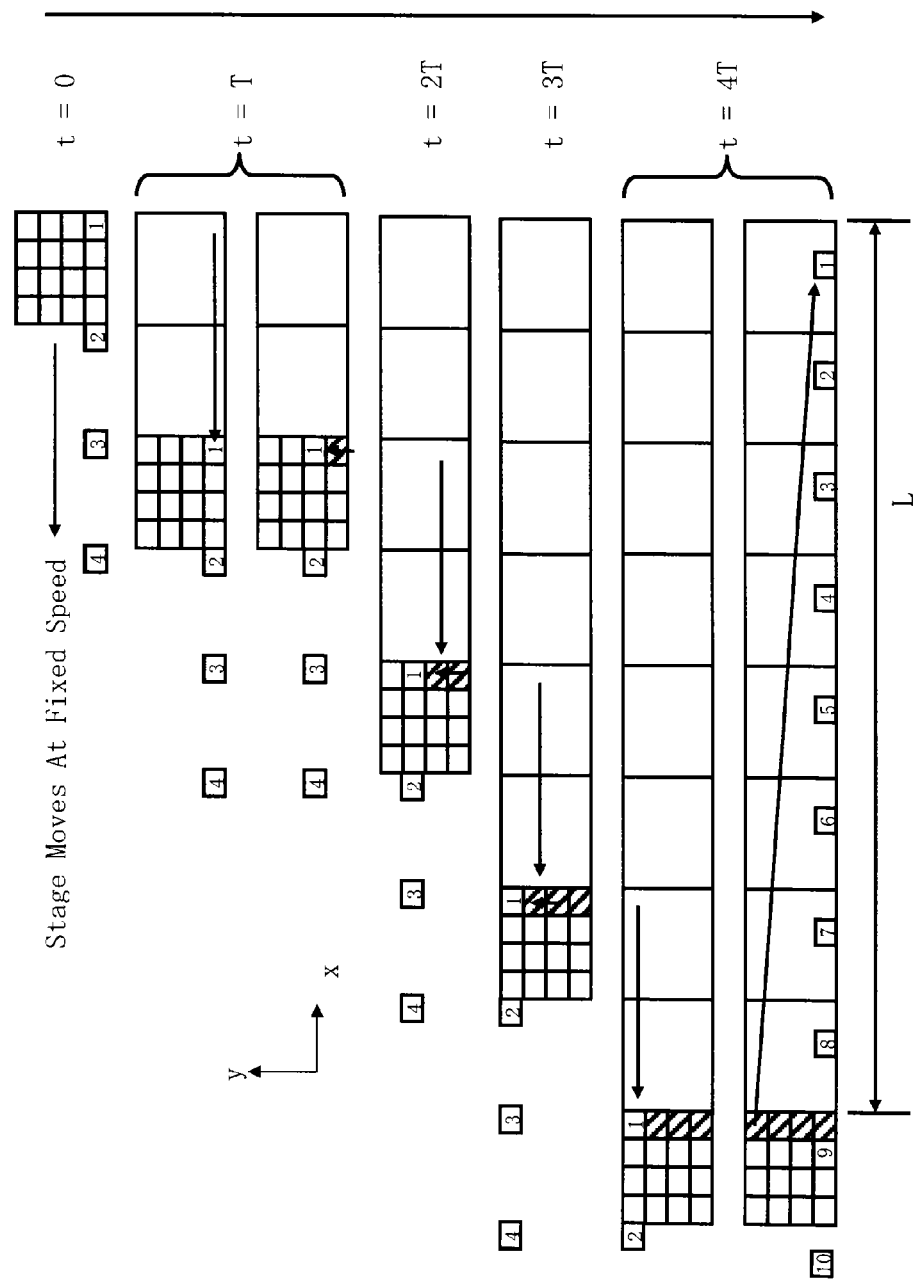
FIG. 7 illustrates an example of a writing method of multi-beams according to the first embodiment.

FIG. 7 illustrates an example of a writing method of multi-beams according to the first embodiment. FIG. 7 shows some grids to be written by respective beams of the coordinates (1, 3), (2, 3), (3, 3), . . . , (512, 3) in the third row from the bottom, where rows are arrayed in the y direction, in the multi-beams for writing the stripe region 32 shown in FIG. 6. In the case of FIG. 7, while the XY stage 105 moves the distance of eight beam pitches, four pixels are written (exposed), for example.

First, the writing data processing unit 50 reads writing data from the storage device 140, and performs a plurality of stages of data conversion processing to generate shot data. Shot data is generated for each pixel 36, and then, the writing time (irradiation time) is calculated. For example, when no pattern is formed in a target pixel 36, since no beam irradiation is performed, an identification code indicating writing time zero or no beam irradiation is defined. Here, the maximum writing time T (maximum exposure time) in one multi-beam shot is set in advance. It is preferable that the irradiation time of each beam to be actually applied is obtained in proportion to a calculated area density of a pattern. Moreover, it is preferable that the irradiation time of each beam to be finally calculated is a time period equivalent to an irradiation amount (dose) after correction in which a dimensional variation (not shown) occurred due to a phenomenon such as the proximity effect, the fogging effect result, and the loading effect has been corrected using an irradiation amount. Therefore, the irradiation time of each beam to be actually applied differs for each beam. The writing time (irradiation time) of each beam is obtained as a value within the maximum writing time T.

The writing data processing unit 50 generates, for each shot of multi-beams, irradiation time arrangement data in which calculated irradiation time data of each pixel, as data for a beam for writing each pixel, is arranged in order of arrangement of each beam of multi-beams. The generated irradiation time arrangement data is stored in the storage device 142. Moreover, the writing data processing unit 50 generates shot data, for each shot of multi-beams. The shot data defines the irradiation position of multi-beams of each shot, and is stored in the storage device 142.

In the deflection control circuit 130, the management unit 61 reads irradiation time arrangement data from the storage device 142, and the read irradiation time arrangement data is stored in one of the buffers 62 and 64 in order of shot. Since, in the case of FIG. 7, four pixels are written (exposed) while the XY stage 105 moves the distance of eight beam pitches, there are four sections in each of the buffers 62 and 64 of FIG. 1. In the first embodiment, one tracking cycle is executed by writing (exposing) four pixels while moving the distance of eight beam pitches. Therefore, irradiation time arrangement data for four shots for writing (exposing) four pixels during the same tracking cycle is stored in one (e.g., buffer 62) of the buffers 62 and 64. Moreover, irradiation time arrangement data for four shots for writing (exposing) four pixels during the next tracking cycle is stored in the other one (e.g., buffer 64) of the buffers 62 and 64. Further, irradiation time arrangement data for four shots for writing (exposing) four pixels during the tracking cycle after the next tracking cycle is stored in one (e.g., buffer 62) of the buffers 62 and 64. Thus, irradiation time arrangement data for four shots is stored for each tracking cycle alternately using the two buffers 62 and 64. In addition, irradiation time arrangement data for one shot is temporarily stored in each section of the buffers 62 and 64. Irradiation time arrangement data is structured by irradiation time data for beams in one row, for example, which is used as a unit, in the multi-beams arranged in two dimensions as shown in FIG. 6. Therefore, when a multi-beam is composed of n×m beams, and one row of the beams is composed of n beams, the number of irradiation time arrangement data to be generated is m. Although only the buffer 62 (or buffer 64) for one row is shown in FIG. 1, the buffers 62 (or buffers 64) for other rows are to be arranged.

In the deflection control circuit 130, the deflection amount calculation unit 60 reads shot data from the storage device 142, and generates deflection amount data for deflecting multi-beams. Moreover, the deflection amount calculation unit 60 generates tracking deflection data for following movement of the XY stage.

In the writing start step (S102), the writing control unit 52 outputs a control signal for performing writing processing to the control circuit (not shown) which drives the deflection control circuit 130 and the writing unit 150. In response to this signal, the writing processing starts.

In the determination step (S104), the management unit 61 determines whether complementary data to be used when a writing error occurs is stored in the buffer 66. When a data transmission error occurs in the transmission step (S110) to be described later, the irradiation time arrangement data having turned out to be a data transmission error is temporarily stored, as complementary data, in the buffer 66. As the writing operation progresses, a data transmission error may be generated while a plurality of times of shots are performed. The management unit 61 determines whether complementary data to be used when a writing error occurs is stored in the buffer 66. When complementary data is stored, it proceeds to the complementary data storing step (S108). When complementary data has not been stored, it proceeds to the exposure data storing step (S106).

In the exposure data storing step (S106), when it is determined in the determination step (S104) that complementary data has not been stored, the selector 70 reads irradiation time arrangement data, as exposure data, from one of the buffers 62 and 64 which is the buffer (e.g., buffer 62) for the tracking cycle concerned, and stores it in the buffer 78 for transmission. The selector 70 deletes the irradiation time arrangement data which has been stored in the buffer 78, from the buffer 62, for example.

In the complementary data storing step (S108), when it is determined in the determination step (S104) that complementary data has been stored, the selector 70 reads irradiation time arrangement data, as complementary data, from the buffer 66, and stores it in the buffer 78 for transmission. The selector 70 deletes the irradiation time arrangement data which has been stored in the buffer 78, from the buffer 66.

In the check step (S109), the check unit 76 generates identification information for checking the irradiation time arrangement data stored in the buffer 78 for transmission. For example, the check unit 76 generates checksum (error detection code) data and defines it for the irradiation time arrangement data.

Figure 8:
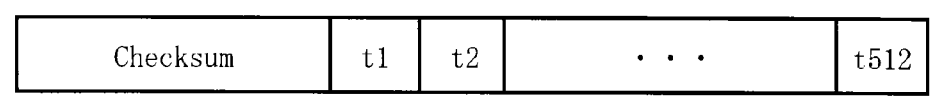

FIG. 8 shows an example of irradiation time arrangement data according to the first embodiment. In FIG. 8, checksum (error detection code) data and irradiation time (t1, t2, . . . , t512) of each of beams in one row are defined in the irradiation time arrangement data.

In the transmission step (S110), the management unit 61 transmits, to the interface circuit 170, irradiation time arrangement data for shot concerned in the irradiation time arrangement data stored for each shot in the buffer 78 for transmission.

Then, in the interface circuit 170, the transmitted irradiation time arrangement data is temporarily stored in the buffer 80.

In the determination step (S112), the check unit 82 checks whether an error has occurred in the transmitted irradiation time arrangement data. For example, the checking is performed using a checksum. A transmission error of irradiation time arrangement data (writing data) for beam irradiation is detected by such checking. When a transmission error is detected, the check unit 82 outputs an error signal to the deflection control circuit 130. When a transmission error is not detected, it proceeds to the shift step (S116). When a transmission error is detected, it proceeds to the complementary data addition step (S114).

In the complementary data addition step (S114), in the deflection control circuit 130, the management unit 61 receives an error signal, immediately reads corresponding irradiation time arrangement data again from the storage device 142, and stores it in the buffer 66. Since the irradiation time arrangement data is for one shot, it should be stored in one of two sections of the buffer 66. If irradiation time arrangement data is generated, for example, for beams in each row of m×n beams, the irradiation time arrangement data for each one row should be stored in the buffer 66. If irradiation time arrangement data is generated for beams whose number (1 or more) is smaller than the number of beams for one row, the irradiation time arrangement data for beams whose number is smaller than that of one row should be stored in the buffer 66. Alternatively, if irradiation time arrangement data is generated for beams whose number is greater than the number of beams for one row, the irradiation time arrangement data for beams whose number is greater than that of one row should be stored in the buffer 66. By this, the determination at the determination step (S104) whether complementary data has been stored or not becomes significant.

Since, according to the first embodiment, whether complementary data has already been stored in the buffer 66 before transmission is determined when irradiation time arrangement data for each shot is transmitted, if a transmission error is detected, with respect to data which has not been stored in the buffer 78 for transmission, complementary data is preferentially stored in the buffer 78 for transmission.

In the shift step (S116), as an initial position adjustment, the writing position of each beam is adjusted (shifted) to the first writing position of the current tracking cycle by collectively deflecting the multi-beam 20 by the deflector 209. In the case of FIG. 7, since there is no previous writing position at the time t=0, adjusting (shifting) is performed with respect to the first pixel from the right in the first row from the bottom of the grid 26 concerned (or "target grid" or "grid of interest"), being the current writing position of each beam, as a pixel to be written.

In the writing and tracking start step (S118), when no data transmission error occurs, tracking control by beam deflection is started such that writing positions of respective beams of the multi-beams 20 collectively follow the movement of the XY stage 105. In other words, the irradiation region 34 which can be irradiated by one irradiation of the multi-beams 20 follows the movement of the XY stage 105. Specifically, the stage position detector 139 measures the position of the XY stage 105 by irradiating a laser to the mirror 210 and receiving a catoptric light from the mirror 210. The measured position of the XY stage 105 is output to the control computer 110. In the control computer 110, the writing control unit 52 outputs the position information on the XY stage 105 to the deflection control circuit 130. In the deflection control circuit 130, deflection amount data (tracking deflection data) is calculated so that beam deflection may be performed to follow the movement of the XY stage 105. Tracking deflection data being a digital signal is output to the DAC amplifier 134. In the DAC amplifier 134, the digital signal is converted to an analog signal and amplified to be applied as a tracking deflection voltage to the deflector 208.

While performing tracking control by beam deflection such that the writing positions of respective beams of the multi-beams 20 collectively follow the movement of the XY stage 105, the writing unit 150 emits a corresponding beam in the "on" state of the multi-beams 20 to a corresponding writing position of each beam during a corresponding writing time within a pre-set maximum writing time T. Specifically, it operates as described below.

The electron beam 200 emitted from the electron gun assembly 201 (emission unit) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated by the electron beam 200. For example, a plurality of quadrangular electron beams (multi-beams) 20a to 20e are formed by letting portions of the electron beam 200 irradiating the positions of a plurality of holes pass through a corresponding hole of the plurality of holes of the aperture member 203 respectively. The multi-beams 20a to 20e respectively pass through corresponding blankers (first deflector: separate blanking system) of the blanking plate 204. Each blanker deflects (performs blanking deflection) a separately passing electron beam 20 to be beam "on" during a calculated writing time (irradiation time) and to be beam "off" during the other time period.

The multi-beams 20a, 20b, ..., 20e having passed through the blanking plate 204 are reduced by the reducing lens 205, and travel toward the hole in the center of the limiting aperture member 206. At this time, the electron beam 20 deflected to be beam "off" by the blanker of the blanking plate 204 deviates from the hole in the center of the limiting aperture member 206 (blanking aperture member) and is blocked by the limiting aperture member 206. On the other hand, the electron beam 20 which was not deflected by the blanker of the blanking plate 204 or was deflected to be beam "on" passes through the hole in the center of the limiting aperture member 206 as shown in FIG. 1. Blanking control is performed by on/off of the separate blanking system in order to control on/off of the beam. Thus, the limiting aperture member 206 blocks each beam which was deflected to be in the "off" state by the separate blanking system. One beam shot is formed by a beam which has been formed during from a beam "on" state to a beam "off" state and has passed through the limiting aperture member 206. The multi beams 20 having passed through the limiting aperture member 206 are focused by the objective lens 207 in order to be a pattern image of a desired reduction rate, and respective beams (the entire multi beams 20) having passed through the limiting aperture member 206 are collectively deflected in the same direction by the deflector 209 so as to irradiate respective writing positions (irradiation positions) on the target object 101. For example, while the XY stage 105 is continuously moving, tracking control is performed by the deflector 208 so that writing positions (irradiation positions) of beams may follow the movement of the XY stage 105. Ideally, multi beams 20 to irradiate at a time are aligned at pitches obtained by multiplying the arrangement pitch of a plurality of holes of the aperture member 203 by the desired reduction rate described above. The writing apparatus 100 executes a writing operation by a method that sequentially performs irradiation of a shot beam while shifting the writing position, and when writing a desired pattern, a beam needed according to a pattern is controlled to be beam "on" by blanking control.

In the case of FIG. 7, using the beam (1) of the coordinates (1, 3), the first pixel from the right in the first row from the bottom of the grid 26 concerned is irradiated by the beam of the first shot during from the time t=0 to the maximum writing time T, for example. The XY stage 105 moves two beam pitches at a fixed speed in the −x direction during the time from t=0 to t=T, for example. During this time period, the tracking operation is continued.

In performing shots, if a data transmission error of corresponding irradiation time arrangement data is detected, the irradiation (shot) of the beam concerned, with respect to which the transmission error has been detected, is stopped (skipped) at the writing position of the beam concerned during the planned irradiation time of the beam concerned. Then, in the tracking cycles (groups) to be performed repeatedly a plurality of times, a tracking time longer than that of other tracking cycles is set, by the writing control unit 52, for the tracking cycle during which irradiation (shot) has been stopped (skipped).

In the determination step (S120), the management unit 61 determines whether the number of times of shots having been performed has reached a specified number of times in the same tracking cycle. Specifically, the management unit 61 inputs the number of times of storing data counted by the writing counter 74, and determines, while regarding the number of times of storing data as the number of times of shots, whether the number of times of shots has reached a specified number of times. Alternatively, the management unit 61 may count the number of times of shots having been actually performed. For example, in the case of FIG. 7, since four pixels are exposed in the same tracking cycle, the number of times of shots is four times. When the number of times of shots reaches the specified number of times, it proceeds to the tracking reset step (S124). When the number of times of shots has not reached the specified number of times, it proceeds to the determination step (S122).

In the determination step (S122), the writing control unit 52 determines whether the tracking time of the tracking cycle being currently executed has exceeded a set time. Specifically, the writing control unit 52 inputs the number of times of storing data counted by the complementary counter 72 and the number of times of storing data counted by the writing counter 74, and determines, while regarding a value obtained by multiplying the sum of the number of times of storing data counted by the two counters by the maximum writing time T, as a tracking time, whether the tracking time has exceeded a set time. Alternatively, the writing control unit 52 may measure the tracking time of the tracking cycle being currently executed. When the tracking time has exceeded the set time, writing processing is stopped as a writing error and the result is output. When the tracking time has not exceeded the set time, it returns to the determination step (S104). Then, in the determination step (S120), each step from the determination step (S104) to the determination step (S122) is repeated until the number of times of shots having been actually performed during the tracking cycle concerned reaches the specified number of times.

For example, in the next shift step (S116) after the writing step (S118), after the maximum writing time T has passed since starting beam irradiation of the shot concerned, while the beam deflection for tracking control is continued by the deflector 208, the writing position of each corresponding beam in a next (new) "on" state of the multi-beams 20e is shifted to a next writing position of the each corresponding beam in the next "on" state by performing another beam deflection of the multi-beams 20, in addition to the beam deflection for tracking control. For example, the writing position of each beam is shifted to a next writing position of each beam by collective deflection of the multi-beams 20 by the deflector 209 which is performed separately from the beam deflection for tracking control. In the case of FIG. 7, when it becomes the time t=T, the pixel to be written is shifted from the first pixel from the right in the first row from the bottom of the grid 26 concerned to the first pixel from the right in the second row from the bottom. Since the XY stage 105 is moving at a fixed speed also during this time period, the tracking operation is continued.

In the writing step (S118) after the second time shift step (S116), while the tracking control is continued, a corresponding beam (next(new) corresponding beam) in a next(new) "on" state of the multi-beams 20 is applied to a corresponding shifted writing position of each corresponding beam in the next "on" state during a corresponding writing time within the maximum writing time T. In the example of FIG. 7, using the beam (1) of the coordinates (1, 3), the first pixel from the right in the second row from the bottom of the grid 26 concerned is irradiated by the beam of the second shot during the time from t=T to t=2T, for example. The XY stage 105 moves two beam pitches at a fixed speed in the −x direction during the time from t=T to t=2T. During this time period, the tracking operation is continued.

As described above, initial position adjustment, beam shot (writing), shift, beam shot (writing), shift, beam shot (writing), and . . . are repeated. In the case of FIG. 7, when it becomes the time t=2T, the pixel to be written is shifted from the first pixel from the right in the second row from the bottom of the grid 26 concerned to the first pixel from the right in the third row from the bottom. Since the XY stage 105 is moving at a fixed speed also during this time period, the tracking operation is continued. Using the beam (1) of the coordinates (1, 3), the first pixel from the right in the third row from the bottom of the grid 26 concerned is irradiated by the beam of the third shot during the time from t=2T to t=3T, for example.

The XY stage 105 moves, for example, two beam pitches at a fixed speed in the −x direction during the time from t=2T to t=3T. During this time period, the tracking operation is continued. When it becomes the time t=3T, the pixel to be written is shifted from the first pixel from the right in the third row from the bottom of the grid 26 concerned to the first pixel from the right in the fourth row from the bottom. Since the XY stage 105 is moving at a fixed speed also during this time period, the tracking operation is continued. Using the beam (1) of the coordinates (1, 3), the first pixel from the right in the fourth row from the bottom of the grid 26 concerned is irradiated by the beam of the fourth shot during the time from t=3T to t=4T, for example. The XY stage 105 moves, for example, two beam pitches at a fixed speed in the −x direction during the time from t=3T to t=4T. During this time period, the tracking operation is continued. By what is described above, writing of the pixels in the first column from the right of the grid 26 concerned has been completed.

In the shift step (S116), when complementary data was stored in the buffer 78 in the complementary data storing step (S108) and the complementary data has been transmitted in the transmission step (S110), the writing position of each beam is shifted to a pixel (pixel which was not exposed by a data transmission error) position corresponding to the complementary data, by collectively deflecting the multi-beams 20 by the deflector 209 while continuing the tracking control. Then, while continuing the tracking control in the writing step (S118), a corresponding beam in the "on" state of the multi-beams 20 is applied to a corresponding shifted writing position of each beam during a corresponding writing time within the maximum writing time T.

In the tracking reset step (S124), after emitting a corresponding beam to the writing position of each beam which has been shifted at least once, in this case it has been shifted three times from the initial position, while continuing tracking control, the DAC amplifier 134 returns the tracking position of the irradiation region 34 to the tracking start position, where the tracking control was started, by resetting the beam deflection for tracking control. In other words, the tracking position is returned in the opposite direction from the direction of the stage movement. In the case of FIG. 7, when it becomes the time t=4T, tracking of the grid 26 concerned is removed, and the beam is swung back to a new grid concerned shifted by eight beam pitches in the x direction. Although the beam (1) of the coordinates (1,3) has been described in the example of FIG. 7, writing is similarly performed for each corresponding grid with respect to a beam of other coordinates. That is, with respect to a beam of the coordinates (n, m), writing of pixels in the first column from the right has been completed for a corresponding grid when the time t=0. For example, with respect to a beam (2) of the coordinates (2,3), writing of pixels in the first column from the right has been completed for a grid adjacent in the −x direction to the grid 26 concerned which is for the beam (1) of FIG. 7.

Since writing of the pixels in the first column from the right of each grid has been completed, after tracking is reset, the deflector 209 performs deflection such that the writing position of each corresponding beam is adjusted (shifted) to the second pixel from the right in the first row from the bottom of each grid, in the first shift step (S116) in the next tracking cycle.

In the determination step (S126), the writing control unit 52 determines whether writing of a target stripe region has been completed. When writing of the target stripe region has been completed, it moves to a next stripe region. When writing of the target stripe region has not been completed yet, it returns to the determination step (S104) and repeats each step from the determination step (S104) to the determination step (S126) until writing of the target stripe region has been completed.

Thus, the tracking control of from starting tracking control to resetting beam deflection is performed repeatedly. A tracking distance L in the direction of tracking (−x direction) from starting tracking control to resetting beam deflection for tracking control is the same or substantially the same in each tracking control. Moreover, the tracking distance L in the tracking direction from starting tracking control to resetting beam deflection for tracking control should be longer than the pitch between beams of the multi-beams as shown in FIG. 7. According to the first embodiment, the size of the beam array which configures the multi-beams is large such as 512×512. Therefore, the tracking distance L is controlled as shown in FIG. 7 to be a distance smaller than the size of the beam array configuring the multi-beams, that is smaller than the size of the irradiation region 34 which can be irradiated by one shot.

As described above, the deflector 209 (first deflector) collectively deflects the multi-beams 20 (specifically, respective beams in the "on" state having passed through the blanking aperture member 206) to writing positions of the respective beams. The deflector 208 (second deflector) collectively deflects the multi-beams 20 (specifically, respective beams in the "on" state having passed through the blanking aperture member 206) in such a way as to follow the movement of the XY stage 105. The deflection control circuit 130 controls the deflector 208 to deflect each beam to a corresponding writing position, and, after the writing time has passed, to deflect each beam to be shifted to a next corresponding writing position of each beam, and also controls the deflector 208 to continue tracking of each beam while each beam irradiates the writing position and while each beam irradiates the writing position which has been shifted at least once, and after each beam irradiates the writing position which has been shifted at least once, to return the tracking position to the tracking start position, where the tracking control was started, by resetting the beam deflection for tracking control.

Figure 9:
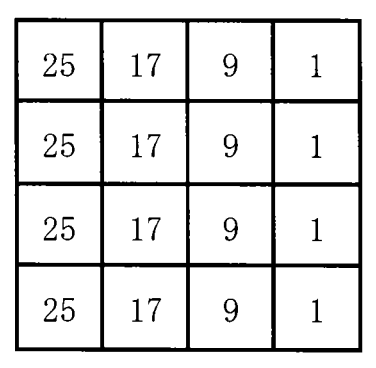

FIG. 9 shows an example of numbers of beams to write respective pixels in a grid concerned according to the first embodiment. FIG. 9 shows the case in which pixels have been shifted by the shift method described with reference to FIG. 7. In FIG. 9, with respect to the grid 26 concerned described in FIG. 7, the pixels in the first column from the right are written by the beam (1), the pixels in the second column from the right are written by the beam (9), the pixels in the third column from the right are written by the beam (17), and the pixels in the fourth column from the right are written by the beam (25).

The writing control method according to the first embodiment will be described below. For the sake of simplicity, first, the control method in the case where the tracking period is uniform is described without executing the step of complementing beam irradiation, and then, the control method according to the first embodiment will be described.

Figure 10:
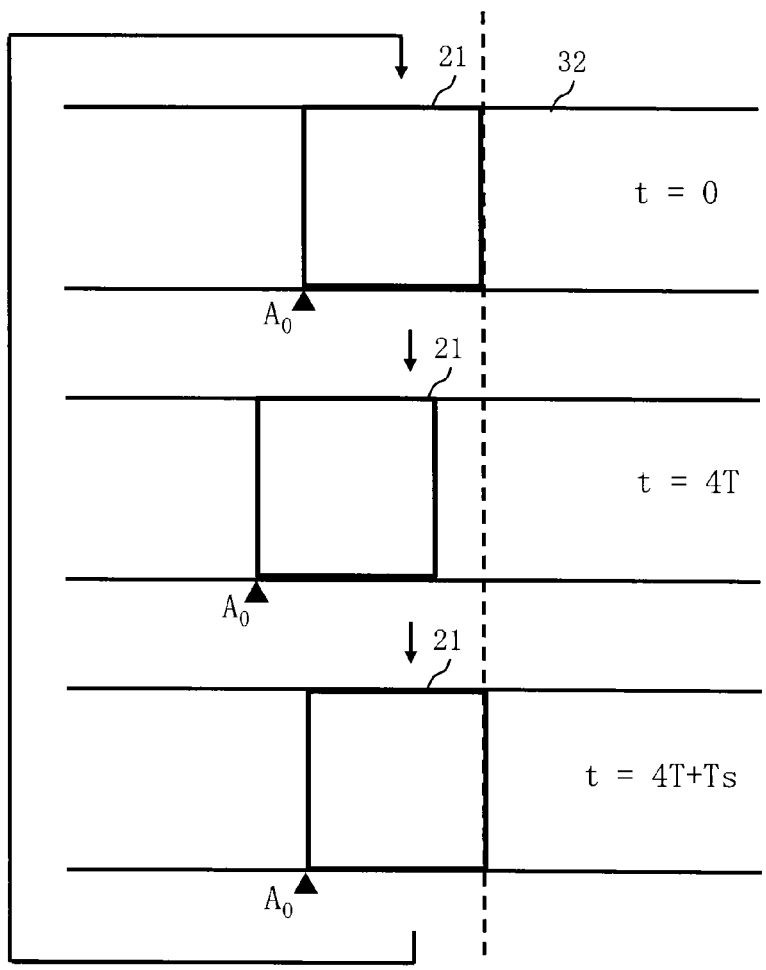
FIGS. 10A to 10C illustrate a tracking control when not performing complementary exposure.

FIGS. 10A to 10O illustrate a tracking control when not performing complementary exposure. In FIGS. 10A to 10O, the deflector 208 performs tracking deflection for a reference position A0 of a region 21 in the stripe region 32 to be written corresponding to the irradiation region 34 which can be irradiated by one irradiation of the multi-beams 20 in such a way as to follow the movement of the XY stage 105. The reference position A0 at the time of starting tracking (time t=0) moves eight beam pitches in the −x direction at the time of t=4T, for example. During this time period, the deflector 208 continues tracking. Then, the beam is swung back by resetting tracking at the time of t=4T, and the region 21 in the stripe region 32 to be written corresponding to the irradiation region 34 shifts to a region away from the former region by eight beam pitches in the x direction. Then, after the settling time Ts of the DAC amplifier unit 134 has passed, a next tracking is started. A tracking cycle is executed by repeating this operation.

Figure 11:
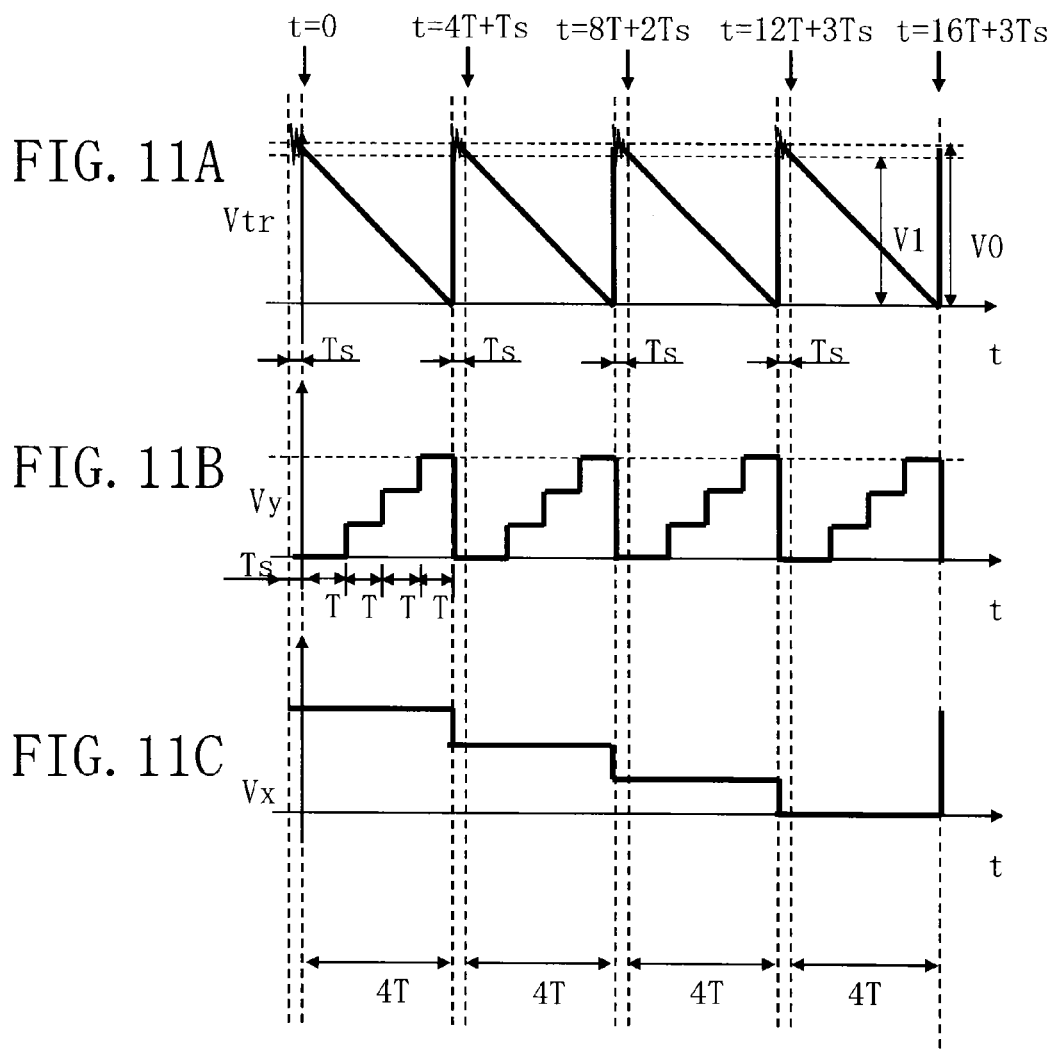
FIGS. 11A to 11C each illustrates a relation between a deflection voltage and a time when not performing complementary exposure.

FIGS. 11A to 11C each illustrates a relation between a deflection voltage and a time when not performing complementary exposure. In FIG. 11A, the ordinate axis shows a deflection voltage Vtr output from the DAC amplifier unit 134 for tracking, and the abscissa axis shows a time t. In FIG. 11B, the ordinate axis shows a deflection voltage Vy, in the y direction, output from the DAC amplifier unit 132 for the deflector 209, and the abscissa axis shows the time t. In FIG. 11C, the ordinate axis shows a deflection voltage Vx, in the x direction, output from the DAC amplifier unit 132 for the deflector 209, and the abscissa axis shows the time t. Although one DAC amplifier unit 132 is shown as a DAC amplifier unit for the deflector 209 in FIG. 1, when it is possible to deflect in the x and y directions, the deflector 209 is configured by four electrodes, for example, and a DAC amplifier unit is connected to each electrode. Moreover, although one DAC amplifier unit 134 is shown as a DAC amplifier unit for the deflector 208 in FIG. 1, when it is possible to deflect in the x and y directions, the deflector 208 is configured by four electrodes, for example, and a DAC amplifier unit is connected to each electrode. If it is possible to deflect only in the x direction, the deflector 208 is configured by two electrodes, for example, and a DAC amplifier unit is connected to each electrode.

FIGS. 11A to 11C show the case in which writing is performed by the writing method illustrated in FIG. 7. Beam deflection for tracking control is performed using the DAC amplifier unit 134 (first deflection amplifier) having a long settling time. Moreover, beam deflection for shifting the writing position of each beam in a grid is performed using the DAC amplifier unit 132 (second deflection amplifier) having a short settling time. Since the shift amount (shift distance) in a grid is fairly small compared with a tracking distance, the settling time can be fairly short. Thereby, deflection can be performed at a high speed. The short settling time of the DAC amplifier unit 132 can be a value ignorable when compared with the long settling time of the DAC amplifier unit 134, and further with the maximum writing time T per shot.

Therefore, first, when the settling time Ts of the DAC amplifier unit 134 has passed (t=0), writing processing of a grid concerned is started. As shown in FIG. 11A, since the tracking operation is continued until it becomes t=4T, the deflection voltage Vtr decreases linearly in the first-order proportion. On the other hand, as shown in FIG. 11B, since each shift in the y direction is performed every t=T, the deflection voltage Vy increases gradually every maximum writing time T per shot until it becomes t=4T. Moreover, as shown in FIG. 11C, since shifting in the x direction is performed every tracking cycle (t=4T+Ts), the deflection voltage Vx decreases stepwise every 4T+Ts. Although Vtr is reset to the initial value at the completion of the tracking cycle, the change amount V0 of Vtr at this time is for deflecting a beam by the distance of the tracking amount L. In the case of FIG. 7, deflection is performed by the distance eight times as long as the beam pitch. Since the time Ts cannot be used for writing after resetting Vtr, the tracking position is returned farther than the writing starting position of during the tracking cycle.

If the tracking cycle is lengthened, the deflection distance for tracking becomes long as shown in FIGS. 10A to 10C and FIGS. 11A to 11C. If the deflection distance becomes long, distortion of the electron optical system increases and the positional deviation of a beam on the surface of the target object becomes large. Therefore, it is preferable for the tracking cycle to have a length due to which beam positional deviation by deflection becomes sufficiently small. Moreover, it is preferable that the voltage range between positive and negative of the tracking deflection voltage Vtr of FIGS. 11A to 11C is equally used so that the deflection voltage may be Vtr=0 in the middle of the tracking cycle. By this, the absolute value of the deflection voltage can be made small, and further deflection distortion can be reduced.

Further, as described above, exposure to the pixel where a data transmission error occurred is complemented according to the first embodiment. Therefore, the writing control unit 52 controls each device under management, such as the deflection control circuit 130 and the writing unit 150, so that writing of the irradiation region 34 (predetermined region) may be completed by repeating the tracking cycle the number of times having been set in advance while regarding each step from starting a tracking control to resetting it as one tracking cycle (group). Moreover, the writing control unit 52 performs controlling such that the tracking time from starting tracking to resetting it in at least one tracking cycle in tracking cycles of the number of times having been set becomes longer than the tracking time of other tracking cycle. Then, the tracking cycle in which shot (irradiation) was stopped (skipped) because a data transmission error occurred complements beam irradiation to the writing position of a beam whose irradiation was stopped, by using a part of the tracking time longer than that of other tracking cycles.

Figure 12:
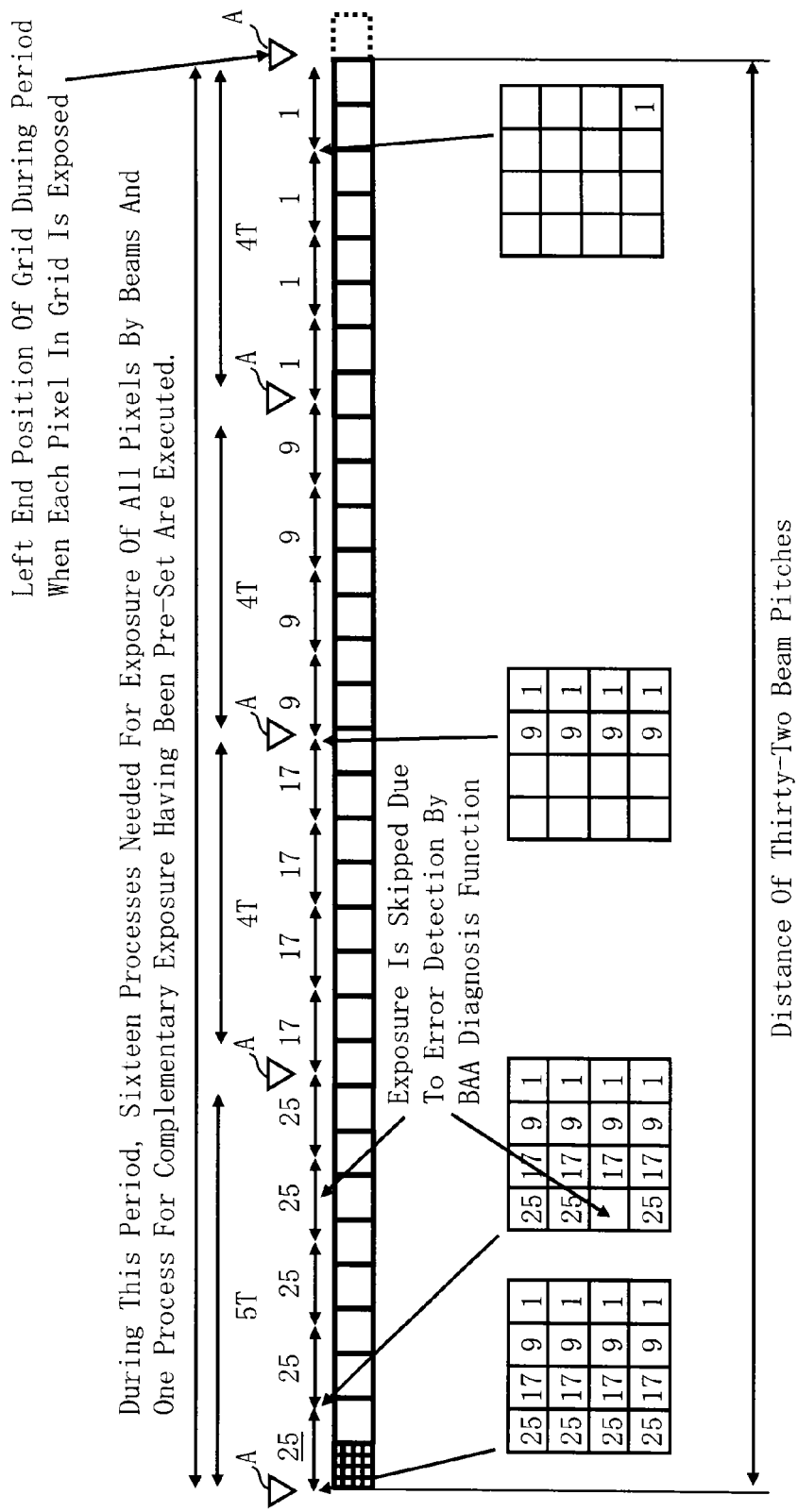
FIG. 12 shows an example of a time chart of the tracking cycle according to the first embodiment.

FIG. 12 shows an example of a time chart of the tracking cycle according to the first embodiment. The left end position A of the grid 26 concerned during the period when 4×4 pixels in the grid 26 concerned are exposed is shown by the arrow. FIG. 12 shows the case where one data transmission error occurs during the fourth tracking cycle when the writing processing is proceeded in accordance with the example of FIG. 7. In the case of FIG. 12, the writing of the grid concerned is completed by repeating four times the tracking cycle that exposes four pixels during eight beam pitches, that is, while the stage advances thirty-two beam pitches the writing of the grid concerned is completed. For example, when not considering a complement of an unexposed pixel which has not been exposed due to a data transmission error, the XY stage should be moved at a speed v1 obtained by dividing thirty-two beam pitches by 4×(4T+3×(shift time)). However, in such a case, a complement is not provided to the unexposed pixel not having been exposed due to the data transmission error. On the other hand, according to the first embodiment, the XY stage is moved at a speed v2 obtained by dividing the thirty-two beam pitches by 3×(4T+3×(shift time))+(5T+4× (shift time)), for example. That is, during the time T, the stage advances the distance shorter than two beam pitches. In other words, with respect to one tracking cycle in the four tracking cycles, one complementary exposure and a shift step for it are added. Thus, a writing error due to a data transmission error can be prevented by making the XY stage movement speed a little slow and using the surplus time, generated while moving thirty-two beam pitches, for complementary exposure and a shift step for it. In the case of FIG. 12, a data transmission error occurs during the fourth tracking cycle that writes the first column from the left by the beam (25), and one complementary exposure time T is used during the fourth tracking cycle.

Figure 13:
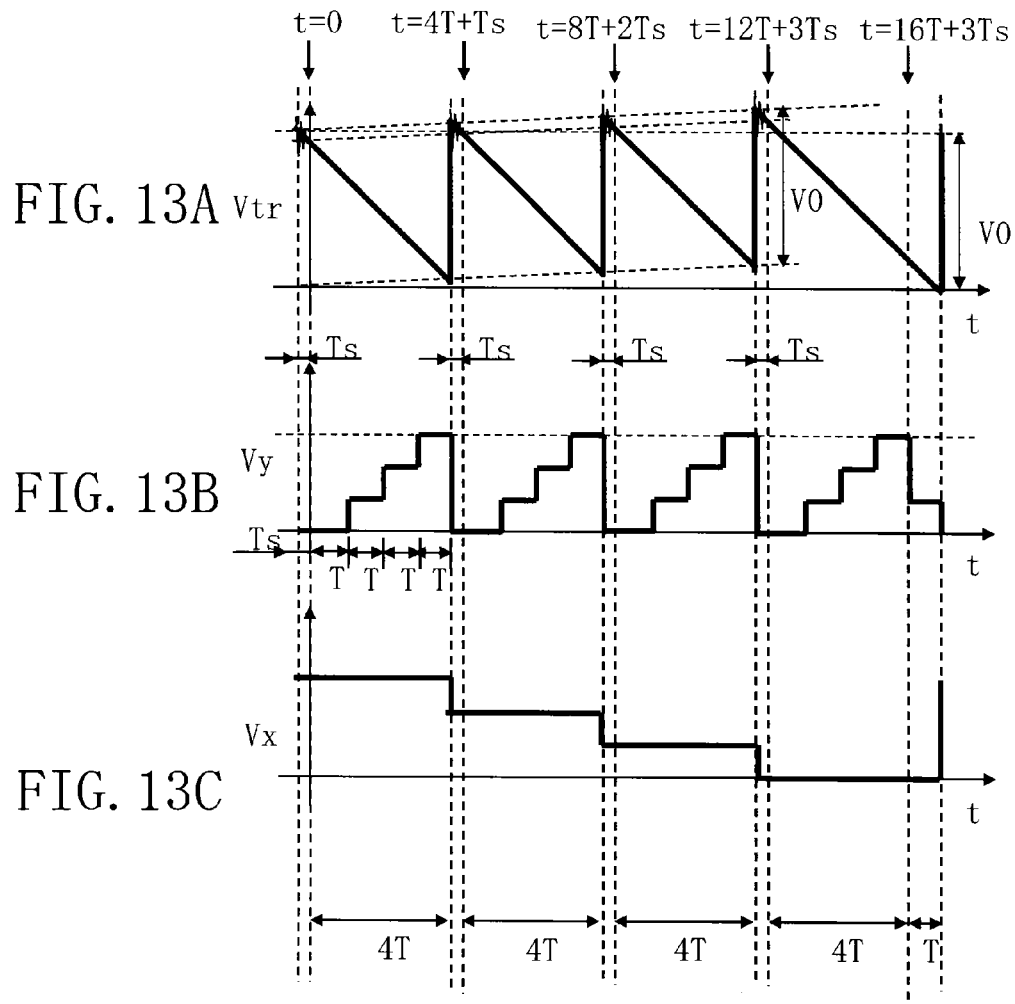
FIGS. 13A to 13O show a relation between the deflection voltage and the time in the case of performing writing of FIG. 12 according to the method of the first embodiment.

FIGS. 13A to 13C show a relation between the deflection voltage and the time in the case of performing writing of FIG. 12 according to the method of the first embodiment. In FIGS. 13A to 13C, the fourth tracking cycle has the length of 5T+Ts longer than that of other cycle by T. In FIGS. 10A to 10C and FIGS. 11A to 11C, Vtr is controlled to return to an initial value at the start time of each tracking cycle so that the tracking deflection voltage Vtr may remain within a fixed range during writing. However, according to the first embodiment, by using the stage speed v2 described above, as shown in FIGS. 13A to 13C, Vtr returns to an initial value at the start time of the first tracking cycle and at the start time of a group of tracking cycles after pre-set tracking cycles have been completed. In the example of FIG. 12, since the number of times having been set is four times, Vtr returns to the initial value also at the start time of the fifth tracking cycle and the ninth tracking cycle.

When comparing FIGS. 11A to 11C with FIGS. 13A to 13C, the gradient of Vtr in FIGS. 13A to 13C is smaller than that of FIGS. 11A to 11C by the amount of the ratio of v2 to v1 described above. On the other hand, V0, which is the width for swinging back Vtr in the case of each tracking cycle having been completed, is a value that deflects the beam position on the surface of the target object by L, and is the same value in FIGS. 11A to 11C and FIGS. 13A to 13C. Therefore, in FIG. 13A, Vtr at the start time of the second tracking cycle, Vtr at that time of the third tracking cycle, and Vtr at that time of the four tracking cycle are gradually shifted in the plus direction. Therefore, it is possible to perform complementary writing in the fourth tracking cycle using a longer cycle than the first to third cycles. In other words, after a tracking cycle in which no complementary exposure is performed, the beam is swung back by the distance larger than the stage advance distance moved during the cycle, in order to secure a tracking time for performing complementary exposure. By contrast, after a tracking cycle in which complementary exposure is performed, the beam is swung back by the distance shorter than the stage advance distance moved during the cycle.

In addition, there may be a case where no data transmission error occurs by the time writing of the grid 26 (predetermined region) has been completed. In such a case, the surplus time should be used for writing stand-by time. In FIG. 12, as described above, since one complementary exposure and a shift step for it are added with respect to one tracking cycle in the four tracking cycles, if no transmission error occurs, the time T should be used as a writing stand-by time at the end of the fourth tracking cycle. It should be understood that the writing stand-by time is an adjustment in order not to make the tracking deflection amount too large.

Although only the time for a complementary exposure to be performed once is prepared in the example of FIG. 12, it is not limited thereto. It is also acceptable to prepare a time for complementary exposure to be performed twice or more according to a generation frequency of a transmission error.

In the examples described above, the interval of pixel shifting is adjusted to be coincident with the maximum exposure time T. However, actually, since a dose correction such as a proximity effect correction is performed, the longest exposure time period (time required for shot) in exposure time periods of all the beams by one shot may be smaller than the maximum exposure time T. In that case, by performing pixel shifting at intervals of the shot time for each shot, it becomes possible to have a surplus time in a tracking cycle in order to use the time for a complementary exposure. For example, although one complementary exposure can be performed with respect to four cycles in FIG. 12, a complementary exposure performed twice or more may be executed depending on a time required for shot.

In the case of FIG. 12, since an error occurs in the fourth tracking cycle, the lengths of the first to fourth tracking cycles are 4T, 4T, 4T, and 5T. If an error occurs in the second tracking cycle, the lengths of the first to fourth tracking cycles are 4T, 5T, 4T, and 4T.

In FIG. 12, although a complementary step is performed in the same tracking cycle where a step of stopping (skipping) shot (irradiation) is performed, it is not limited thereto. For example, a pixel which could not be written because of an error at the end of the third tracking cycle of FIG. 12 may be written at the beginning of the fourth tracking cycle. In that case, while there is an enough time for controlling, such as data retransmission to the blanking aperture, it becomes necessary to swing back the beam the distance L or more by the deflector 209, thereby being not preferable in terms of writing precision.

As described above, in a group of tracking cycles, when performing tracking reset at the completion of tracking cycles (the first to third tracking cycles shown in FIG. 13A) each of which does not include a step for complementing beam irradiation to the writing position of the beam whose irradiation was stopped, it is preferable that the tracking cycle is returned (in −Vtr direction) farther than the tracking start position where tracking control was started. When performing tracking reset at the completion of a tracking cycle (the fourth tracking cycle shown in FIG. 13A) which includes a step for complement, it is preferable that the tracking cycle is returned (in +Vtr direction) shorter than the tracking start position where tracking control was started. Thus, the tracking positions after resetting differ from each other in a plurality of continuous tracking cycles.

Although, in the cases described above, shifting is performed by the deflector 209 so that a column in the y direction in a grid may be written by the same beam during a tracking cycle as shown in FIGS. 7 and 9, it is not limited thereto.

FIG. 14 shows another example of numbers of beams to write respective pixels in a grid concerned according to the first embodiment. In FIG. 14, using the beam (1), the first pixel from the right in the first row from the bottom of a grid concerned is exposed by the beam of the first shot during the time from t=0 to t=T. The XY stage 105 moves, for example, two beam pitches at a fixed speed in the −x direction during the time from t=0 to t=T. During this time period, the tracking operation is continued.

When it becomes the time t=T, the pixel to be written is shifted from the first pixel from the right in the first row from the bottom of the grid 26 concerned to the second pixel from the right in the first row from the bottom. Since the XY stage 105 is moving at a fixed speed also during this time period, the tracking operation is continued.

Then, using the beam (1), the second pixel from the right in the first row from the bottom of the grid 26 concerned is irradiated by the beam of the second shot during the time from t=T to t=2T, for example. The XY stage 105 moves, for example, two beam pitches at a fixed speed in the −x direction during the time from t=T to t=2T. During this time period, the tracking operation is continued.

When it becomes the time t=2T, the pixel to be written is shifted from the second pixel from the right in the first row from the bottom of the grid 26 concerned to the third pixel from the right in the first row from the bottom. Since the XY stage 105 is moving at a fixed speed also during this time period, the tracking operation is continued.

Then, using the beam (1), the third pixel from the right in the first row from the bottom of the grid 26 concerned is irradiated by the beam of the third shot during the time from t=2T to t=3T, for example. The XY stage 105 moves, for example, two beam pitches at a fixed speed in the −x direction during the time from t=2T to t=3T. During this time period, the tracking operation is continued.

When it becomes the time t=3T, the pixel to be written is shifted from the third pixel from the right in the first row from the bottom of the grid 26 concerned to the fourth pixel from the right in the first row from the bottom. Since the XY stage 105 is moving at a fixed speed also during this time period, the tracking operation is continued.

Then, using the beam (1), the fourth pixel from the right in the first row from the bottom of the grid 26 concerned is irradiated by the beam of the fourth shot during the time from t=3T to t=4T, for example. The XY stage 105 moves, for example, two beam pitches at a fixed speed in the −x direction during the time from t=3T to t=4T. During this time period, the tracking operation is continued. By the operations described above, writing of the pixels in the first row from the bottom of the grid 26 concerned is completed.

After emitting a corresponding beam to the writing position of each beam which has been shifted at least once, in this case three times, while continuing the tracking control, the DAC amplifier 134 returns the tracking position to the tracking start position, where the tracking control was started, by resetting the beam deflection for tracking control.

Since writing of the pixels in the first row from the bottom of each grid has been completed, when the tracking is reset, the deflector 209 performs deflection such that the writing position of each corresponding beam is adjusted (shifted) to coincide with the first pixel from the right in the second row from the bottom of each grid.

As shown in FIGS. 10A to 10O, by repeating the operations described above, with respect to the grid 26 concerned, the pixels in the first row from the bottom are written by the beam (1), the pixels in the second row from the bottom are written by the beam (9), the pixels in the third row from the bottom are written by the beam (17), and the pixels in the fourth row from the bottom are written by the beam (25).

Although, in the examples described above, the case of tracking the amount of eight beam pitches has been described, it is not limited thereto.

FIG. 15 shows another example of numbers of beams to write respective pixels in a grid concerned according to the first embodiment. FIG. 15 shows a case of exposing two pixels while tracking the amount of four beam pitches. Using the beam (1), the first pixel from the right in the first row from the bottom of the grid concerned is exposed by the beam of the first shot during the time from t=0 to t=T. The XY stage 105 moves, for example, two beam pitches at a fixed speed in the −x direction during the time from t=0 to t=T. During this time period, the tracking operation is continued.

When it becomes the time t=T, the pixel to be written is shifted from the first pixel from the right in the first row from the bottom of the grid 26 concerned to the first pixel from the right in the second row from the bottom. Since the XY stage 105 is moving at a fixed speed also during this time period, the tracking operation is continued.

Then, using the beam (1), the first pixel from the right in the second row from the bottom of the grid 26 concerned is irradiated by the beam of the second shot during the time from t=T to t=2T, for example. The XY stage 105 moves, for example, two beam pitches at a fixed speed in the −x direction during the time from t=T to t=2T. During this time period, the tracking operation is continued.

After emitting a corresponding beam to the writing position of each beam which has been shifted at least once, in this case once, while continuing the tracking control, the DAC amplifier 134 returns the tracking position to the tracking start position, where the tracking control was started, by resetting the beam deflection for tracking control.

Since writing of the two first pixels from the right in the first and second rows from the bottom of each grid has been completed, when the tracking is reset, the deflector 209 performs deflection such that the writing position of each corresponding beam is adjusted (shifted) to coincide with the second pixel from the right in the first row from the bottom of each grid.

As shown in FIG. 15, by repeating the operations described above, with respect to the grid 26 concerned, the two first pixels from the right in the first and second rows from the bottom are written by the beam (1), the two second pixels from the right in the first and second rows from the bottom are written by the beam (9), the two third pixels from the right in the first and second rows from the bottom are written by the beam (17), and the two fourth pixels from the right in the first and second rows from the bottom are written by the beam (25). The two first pixels from the right in the third and fourth rows from the bottom are written by the beam (5), the two second pixels from the right in the third and fourth rows from the bottom are written by the beam (13), the two third pixels from the right in the third and fourth rows from the bottom are written by the beam (21), and the two fourth pixels from the right in the third and fourth rows from the bottom are written by the beam (29).

As described above, according to the first embodiment, complement can be performed even when a data transmission error occurs. Accordingly, it becomes possible to avoid turning out to be a writing error and to avoid forming a target object including a writing error. Moreover, compared with the case where tracking control is reset for each shot, the number of times of resetting the tracking control can be reduced according to the first embodiment. Therefore, the number of times of settling time generation of the DAC amplifier unit 134 for tracking control can be reduced. Accordingly, the writing time can be shortened.

Second Embodiment

Although in the first embodiment the structure is configured by separating the deflector 208 for tracking and the DAC amplifier unit 134 from the deflector 209 for position deflection (shifting) and the DAC amplifier unit 132, it is not limited thereto.

Figure 16:
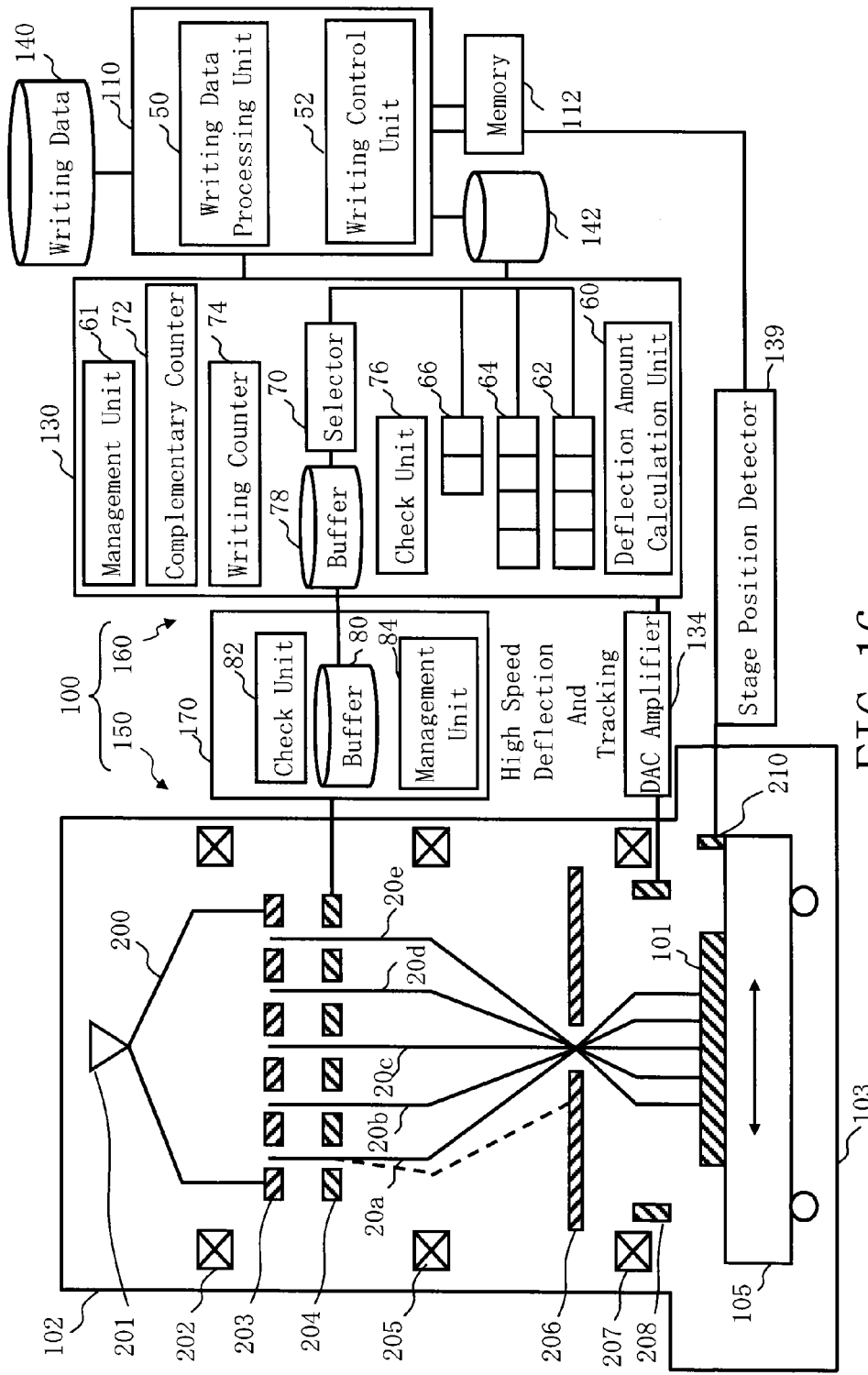
FIG. 16 is a schematic diagram showing a configuration of a writing apparatus according to the second embodiment.

FIG. 16 is a schematic diagram showing the configuration of a writing apparatus according to the second embodiment. FIG. 16 is the same as FIG. 1 except that the deflector 209 and the DAC amplifier unit 132 are not provided. According to the second embodiment, both the deflection for tracking and the deflection for position deflection (shifting) are performed by the deflector 208 and the DAC amplifier unit 134. Main steps of the writing method according to the second embodiment are the same as those in FIG. 5. The contents of the present embodiment are the same as those of the first embodiment except what is described below.

According to the second embodiment, the deflector 208 collectively deflects respective beams in the "on" state having passed through the blanking aperture member 206 to writing positions of the respective beams, and collectively deflects respective beams in such a way as to follow the movement of the XY stage 105. The deflection control circuit 130 controls the deflector 208 to deflect each beam to a corresponding writing position, and after the maximum writing time T has passed, to deflect each beam to be shifted to a next corresponding writing position of each beam. In addition, the deflection control circuit 130 controls the deflector 208 to continue tracking of each beam while each beam irradiates the writing position and while each beam irradiates the writing position which has been shifted at least once, and after each beam irradiates the writing position which has been shifted at least once, to return the tracking position to the tracking start position, where the tracking control was started, by resetting the beam deflection for tracking control. Specifically, tracking deflection data should be added to position deflection data, to be output to the DAC amplifier.

The embodiments have been explained referring to concrete examples described above. However, the present invention is not limited to these specific examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam writing method and multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:

emitting each corresponding beam in an "on" state in multi charged particle beams to a writing position of the each corresponding beam while starting and continuing tracking control by performing beam deflection such that the writing position of the each corresponding beam of the multi charged particle beams collectively follow a movement of a stage;

shifting a writing position of each corresponding beam in a next "on" state in the multi charged particle beams to a next writing position of the each corresponding beam in the next "on" state by performing beam deflection of the multi charged particle beams, in addition to the beam deflection for the tracking control, while continuing the tracking control;

emitting the each corresponding beam in the next "on" state in the multi charged particle beams to the next writing position having been shifted of the each corresponding beam in the next "on" state while continuing the tracking control; and returning a tracking position in an opposite direction from the movement of the stage by resetting the tracking control by performing the beam deflection, after emitting each next corresponding beam to the next writing position having been shifted at least once of the each corresponding beam in the next "on" state while continuing the tracking control, wherein writing of a predetermined region is completed by repeating, a number of times having been set in advance, a group of performing the emitting the each corresponding beam during from the starting the tracking control to the resetting the tracking control, performing the shifting, performing the emitting after the shifting, and performing the returning the tracking position in the opposite direction, and with respect to the group repeated the number of times having been set in advance, a tracking time, from the starting the tracking control to the resetting the tracking control, in at least one the group is longer than the tracking time of other group.

2. The method according to claim 1, further comprising:
detecting a transmission error of writing data for the emitting the each corresponding beam of the multi charged particle beams, wherein stopping is executed against emitting a beam in which the transmission error was detected to a writing position of the beam concerned during a planned irradiation time of the beam concerned, setting the tracking time longer than that of other group is performed for a group for which the stopping is executed against the emitting in groups repeated the number of times having been set, and with respect to the group for which the stopping is executed against the emitting, complementing is performed for the emitting the beam in which the transmission error was detected to the writing position of the beam concerned, by using a part of the tracking time longer than the that of other group.

3. The method according to claim 2, wherein the complementing is performed during the same tracking control in which the stopping of the emitting is performed.

4. The method according to claim 2, wherein the predetermined region is a region surrounded by four adjacent beams in the multi charged particle beams and including one of writing positions of the four adjacent beams, and when the transmission error occurs in the writing of the predetermined region, the complementing is performed before the writing of the predetermined region is completed.

5. The method according to claim 1, wherein the emitting, the shifting, the emitting after the shifting, and the returning in the opposite direction, which configure the group, are included in a tracking cycle.

6. The method according to claim 2, wherein, in the group included in a tracking cycle from the starting the tracking control to the resetting the tracking control, when performing tracking reset at completion of the tracking cycle which does not include the complementing the emitting the each corresponding beam to the writing position of the beam for which the stopping of the emitting is performed, the tracking cycle is returned farther than a tracking start position where the tracking control was started, and when performing the tracking reset after completing the tracking cycle which includes the complementing, the tracking cycle is returned shorter than the tracking start position where the tracking control was started.

7. The method according to claim 1, wherein, when the returning the tracking position in the opposite direction from the movement of the stage by the resetting the beam deflection for the tracking control after the emitting the each corresponding beam to the next writing position having been shifted at least once of the each corresponding beam while continuing the tracking control, the tracking position after the resetting differ from each other in a plurality of continuous tracking cycles.

8. The method according to claim 2, wherein, when performing the complementing, a number of times of the shifting increases according to a number of times of the complementing.

9. A multi charged particle beam writing apparatus comprising:
a stage configured to mount a target object thereon and to be continuously movable;
an emission unit configured to emit a charged particle beam;
an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
a blanking plate in which there are arranged a plurality of blankers configured to respectively perform blanking deflection for a corresponding beam of the multiple beams having passed through the plurality of openings of the aperture member;
a blanking aperture member configured to block each beam having been deflected to be in an "off" state by at least one of the plurality of blankers;
a first deflector configured to collectively deflect each beam in an "on" state having passed through the blanking aperture member to a writing position of the each beam;
a second deflector configured to collectively deflect the each beam in the "on" state having passed through the blanking aperture member in such a way as to follow a movement of the stage; and
a deflection control unit configured to control the first deflector to deflect the each beam in the "on" state to a corresponding writing position, and after a writing time has passed, to deflect the each beam in the "on" state to be shifted to a next corresponding writing position, and to control the second deflector to continue tracking to follow the movement of the stage with respect to the each beam in the "on" state while the each beam irradiates the writing position and while the each beam irradiates the writing position which has been shifted at least once, and after the each beam irradiates the writing position which has been shifted at least once, to return a tracking position in an opposite direction from the movement of the stage by resetting the beam deflection for the tracking control, wherein writing of a predetermined region is completed by repeating, a number of times having been set, a group of performing the emitting the each corresponding beam to the writing position of the each beam during from the starting the tracking control to the resetting the tracking control, and performing the emitting the each corresponding beam to the next writing position having been shifted at least once, and with respect to the group repeated the number of times having been set, a tracking time, from the starting the tracking control to the resetting the tracking control, in at least one the group is longer than the tracking time of other group.

10. A multi charged particle beam writing apparatus comprising:
a stage configured to mount a target object thereon and to be continuously movable;
an emission unit configured to emit a charged particle beam;
an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;

a blanking plate in which there are arranged a plurality of blankers configured to respectively perform blanking deflection for a corresponding beam of the multiple beams having passed through the plurality of openings of the aperture member;

a blanking aperture member configured to block each beam having been deflected to be in an "off" state by at least one of the plurality of blankers;

a deflector configured to collectively deflect the each beam in an "on" state having passed through the blanking aperture member to a writing position of the each beam, and collectively deflect the each beam in the "on" state in such a way as to follow a movement of the stage; and a deflection control unit configured to control the deflector to deflect the each beam in the "on" state to a corresponding writing position, and after a writing time has passed, to deflect the each beam in the "on" state to be shifted to a next corresponding writing position, and to control the deflector to continue tracking of the each beam in the "on" state while the each beam irradiates the writing position and while the each beam irradiates the writing position which has been shifted at least once, and after the each beam irradiates the writing position which has been shifted at least once, to return a tracking position in an opposite direction of the movement of the stage, by resetting the beam deflection for the tracking control, wherein writing of a predetermined region is completed by repeating, a number of times having been set, a group of performing the emitting the each corresponding beam in the "on" state to the writing position of the each beam in the "on" state during from the starting the tracking control to the resetting the tracking control, and performing the emitting the each corresponding beam in the "on" state to the next writing position having been shifted at least once, and with respect to the group repeated the number of times having been set, a tracking time, from the starting the tracking control to the resetting the tracking control, in at least one the group is longer than the tracking time of other group.

* * * * *